(12) United States Patent
Sakugawa et al.

(10) Patent No.: US 10,556,314 B2
(45) Date of Patent: Feb. 11, 2020

(54) HEAD HEIGHT ADJUSTMENT DEVICE AND SUBSTRATE PROCESSING APPARATUS PROVIDED WITH HEAD HEIGHT ADJUSTMENT DEVICE

(71) Applicant: EBARA CORPORATION, Tokyo (JP)

(72) Inventors: Suguru Sakugawa, Tokyo (JP); Toru Maruyama, Tokyo (JP); Nobuyuki Takahashi, Tokyo (JP); Zhongxin Wen, Tokyo (JP); Yoichi Shiokawa, Tokyo (JP); Keita Yagi, Tokyo (JP); Itsuki Kobata, Tokyo (JP); Tomohiko Takeuchi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 98 days.

(21) Appl. No.: 15/636,343

(22) Filed: Jun. 28, 2017

(65) Prior Publication Data
US 2018/0001438 A1    Jan. 4, 2018

(30) Foreign Application Priority Data

Jun. 30, 2016    (JP) ................. 2016-130461

(51) Int. Cl.
*B24B 37/005* (2012.01)
*B24B 37/10* (2012.01)
*H01L 21/306* (2006.01)

(52) U.S. Cl.
CPC .......... *B24B 37/005* (2013.01); *B24B 37/10* (2013.01); *H01L 21/30625* (2013.01)

(58) Field of Classification Search
None
See application file for complete search history.

(56) References Cited

U.S. PATENT DOCUMENTS

| 6,561,881 | B2 | 5/2003 | Jeong |
| 2008/0070479 | A1 | 3/2008 | Nabeya et al. |
| 2017/0047237 | A1 | 2/2017 | Kobata et al. |
| 2018/0001438 | A1* | 1/2018 | Sakugawa ............. B24B 37/005 |

FOREIGN PATENT DOCUMENTS

| JP | H04-063649 A | 2/1992 |
| JP | H07-013878 U | 3/1995 |
| JP | 2006-128582 A | 5/2006 |
| JP | 2010-094692 A | 4/2010 |
| JP | 2011-083800 A | 4/2011 |
| WO | WO 2005/016595 A1 | 2/2005 |
| WO | WO 2015/159973 A1 | 10/2015 |

* cited by examiner

Primary Examiner — Sylvia Macarthur
(74) Attorney, Agent, or Firm — Baker Hostetler LLP

(57) ABSTRACT

According to one aspect, a substrate processing apparatus is provided. The substrate processing apparatus includes a table provided with a substrate holding surface for holding a substrate, a pad for processing the substrate held on the table, a head for holding the pad, an actuator for moving the head in a direction perpendicular to the substrate holding surface of the table, and a mechanical stopper device for stopping a movement of the head in the direction perpendicular to the substrate holding surface.

15 Claims, 20 Drawing Sheets

HEAD HEIGHT ADJUSTMENT DEVICE AND SUBSTRATE PROCESSING APPARATUS PROVIDED WITH HEAD HEIGHT ADJUSTMENT DEVICE

CROSS-REFERENCE TO RELATED APPLICATION

This application is based upon and claims the benefit of priority of the prior Japanese Patent Application No. 2016-130461, filed on Jun. 30, 2016, the entire content of which is incorporated herein by reference.

BACKGROUND

The present invention relates to a head height adjustment device and a substrate processing apparatus provided with the head height adjustment device.

DESCRIPTION OF THE RELATED ART

Chemical mechanical polishing (CMP) apparatuses are known as apparatuses for polishing substrate surfaces in manufacturing semiconductor devices. In a CMP apparatus, a polishing pad is stuck to a top surface of a polishing table to form a polishing surface. This CMP apparatus pushes a surface to be polished of a substrate held by a top ring against the polishing surface and rotates the polishing table and the top ring while supplying slurry as a polishing liquid to the polishing surface. This causes the polishing surface and the surface to be polished to relatively move slidably, and the surface to be polished is thereby polished.

Regarding flattening techniques including CMP, there are a wide variety of materials to be polished and requirements for polishing performance (e.g., flatness, polishing damage, and further productivity) are becoming stricter in recent years. With an introduction of more refined semiconductor devices, there is a growing demand for polishing performance and cleanliness in CMP apparatuses.

Under such circumferences, substrates may be processed using polishing pads smaller in size than the substrates to be processed in the CMP apparatuses (e.g., U.S. Pat. No. 6,561,881, Specification). Generally, a polishing pad smaller in size than a substrate to be processed can flatten locally generated unevenness on a substrate, polish only specific parts of the substrate or adjust the amount of polishing in accordance with the position of the substrate, and provides excellent controllability.

On the other hand, new flattening methods are also being proposed, and a catalyst referred etching (hereinafter, referred to as "CARE") method is one such example. In the presence of a processing liquid, the CARE method generates a seed of reaction with a surface to be polished from within the processing liquid only in the vicinity of a catalyst material, causes the catalyst material and the surface to be polished to come closer to or come into contact with each other, and can thereby selectively make etching reaction occur on the surface to be polished (e.g., International Publication No. WO2015/159973, pamphlet). For example, with an uneven surface to be polished, selective etching of convex parts is made possible by causing the convex parts and the catalyst material to come closer to or come into contact with each other and it is possible to further flatten the surface to be polished.

An airbag may be used for the polishing pad in a CMP apparatus or CARE apparatus. In the case of the CMP apparatus or CARE apparatus, a polishing pad is stuck to an undersurface of the airbag. It is possible to cause the airbag to swell under a pressure of air supplied, cause the polishing pad to uniformly contact the substrate to be polished and adjust the contact pressure. When the substrate is polished, a polishing speed depends on a contact area between the polishing pad and the substrate, and the polishing speed decreases as the contact area decreases. In the CMP apparatus or CARE apparatus, the polishing pad is consumed or deteriorates, and therefore the polishing pad needs to be replaced. When the polishing pad is replaced, a situation of contact between the polishing pad and the substrate until then may change. When a polishing pad smaller in size than the substrate to be processed is used to partially polish the substrate, it is necessary to accurately control an amount of local polishing of the substrate, and it is therefore not desirable that the situation of contact between the polishing pad and the substrate be changed due to the replacement of the polishing pad. For this reason, every time the polishing pad is replaced, an operation of adjusting the height of the polishing head provided with the polishing pad is carried out to optimize the situation of contact between the polishing pad and the substrate.

It is an object of the present invention to provide a height adjustment device to easily adjust the height of the processing head with respect to the substrate.

SUMMARY

According to a first aspect, a substrate processing apparatus is provided and such a substrate processing apparatus includes a table provided with a substrate holding surface for holding a substrate, a pad for processing the substrate held on the table, a head for holding the pad, an actuator for moving the head in a direction perpendicular to the substrate holding surface of the table, and a mechanical stopper device for stopping a movement of the head in the direction perpendicular to the substrate holding surface, in which the mechanical stopper device includes a first member that can move in a first direction which is a direction parallel to the substrate holding surface and has a first inclined surface that forms a predetermined angle with respect to the first direction and a second member that has a second inclined surface that slidably contacts the first inclined surface of the first member, the second member is provided with a stopping surface for defining a stop position of the head when the actuator of a lifting member for lifting/lowering the actuator, the lifting member being connected to the actuator, comes into contact the stopping surface, the stopping surface of the second member is displaceable in a second direction perpendicular to the substrate holding surface when the first member moves in the first direction. According to the substrate processing apparatus of the first aspect, the mechanical stopper device can determine the stop position of the head and it is possible to adjust the stop position of the head by adjusting the mechanical stopper device.

According to a second aspect, in the substrate processing apparatus according to the first aspect, the mechanical stopper device includes a ball screw for moving the first member in the first direction, and a screw shaft of the ball screw extends in the first direction. According to the substrate processing apparatus according to the second aspect, it is possible to adjust a stop position of the mechanical stopper using the ball screw and more easily adjust the stop position of the head.

According to a third aspect, in the substrate processing apparatus according to the second aspect, in the mechanical stopper device, the screw shaft of the ball screw is driven to rotate by a motor.

According to a fourth aspect, in the substrate processing apparatus according to any one of the first to third aspects, the second member of the mechanical stopper device includes a bolt extending in the second direction and a screw receiving part that can receive the bolt, and the stopping surface is defined in the head of the bolt.

According to a fifth aspect, in the substrate processing apparatus according to any one of the first to fourth aspects, the predetermined angle of the first inclined surface is determined so that the second member is not displaced with respect to the first member when a force F is applied from the actuator to the second member of the mechanical stopper device.

According to a sixth aspect, in the substrate processing apparatus according to any one of the first to fifth aspects, the actuator includes an air cylinder for moving the head under an air pressure.

According to a seventh aspect, the substrate processing apparatus according to any one of the first to sixth aspects includes a displacement sensor for measuring a position of the head with respect to the surface of the substrate held on the table. According to the substrate processing apparatus according to the seventh aspect, by controlling the substrate processing apparatus in accordance with the position of the head with respect to the surface of the measured substrate to be processed, it is possible to maintain an appropriate state of contact between the pad and the substrate during processing.

According to an eighth aspect, the substrate processing apparatus according to the seventh aspect includes a lifting member for lifting/lowering the head, the lifting member being connected to the actuator; and a base member disposed at a predetermined distance with respect to the substrate holding surface of the table, in which the displacement sensor is attached to the lifting member and can measure a distance between the lifting member and the base member.

According to a ninth aspect, the substrate processing apparatus according to the seventh aspect includes a lifting member for lifting/lowering the head, the lifting member being connected to the actuator, in which the displacement sensor is attached to the lifting member and can measure a distance between the lifting member and the surface of the substrate held on the table.

According to a tenth aspect, the substrate processing apparatus according to the eighth aspect includes a second displacement sensor attached to the base member, in which the second displacement sensor can measure a distance between the base member and the surface of the substrate held on the table.

According to an eleventh aspect, in the substrate processing apparatus according to any one of the first to tenth aspects, the head includes a fluid storing chamber that stores a fluid, the fluid storing chamber includes an elastic region that is elastically deformed in accordance with a pressure of the fluid stored and the pad is attached to the elastic region.

According to a twelfth aspect, in the substrate processing apparatus according to the eleventh aspect, the fluid storing chamber is formed of an airbag.

According to a thirteenth aspect, in the substrate processing apparatus according to the eleventh aspect, the elastic region of the fluid storing chamber is formed of an elastic film.

According to a fourteenth aspect, the substrate processing apparatus according to any one of the eleventh to thirteenth aspects, further includes an electropneumatic regulator for controlling a pressure of the fluid supplied to the fluid storing chamber.

According to a fifteenth aspect, in the substrate processing apparatus according to any one of the first to fourteenth aspects, the substrate processing apparatus processes the substrate through catalyst referred etching.

According to a sixteenth aspect, in the substrate processing apparatus according to any one of the first to fifteenth aspects, the pad includes an opening and the opening is configured to supply a fluid to be used for processing of the substrate to the surface of the substrate.

According to a seventeenth aspect, a mechanical stopper device is provided, and such a mechanical stopper device includes a first member that can move in a first direction and has a first inclined surface that forms a predetermined angle with respect to the first direction and a second member that has a second inclined surface that slidably contacts the first inclined surface of the first member, the second member is provided with a stopping surface for defining a stop position of another moving member, when the another moving member comes into contact the stopping surface, and the stopping surface of the second member is displaceable in a second direction perpendicular to the first direction when the first member moves in the first direction. According to the mechanical stopper device according to the seventeenth aspect, the mechanical stopper device can determine the stop position of the other moving member and by adjusting the mechanical stopper device, it is possible to adjust the stop position of the other moving member.

According to an eighteenth aspect, the mechanical stopper device according to the seventeenth aspect includes a ball screw for moving the first member in the first direction, and a screw shaft of the ball screw extends in the first direction.

According to a nineteenth aspect, in the mechanical stopper device according to the eighteenth aspect, the screw shaft of the ball screw is driven to rotate by a motor.

According to the twentieth aspect, in the mechanical stopper device according to any one of the seventeenth to nineteenth aspects, the second member includes a bolt that extends in the second direction and a screw receiving part that receives the bolt in an engageable manner, in which the stopping surface is defined in the head of the bolt.

According to a twenty-first aspect, in the mechanical stopper device according to any one of the seventeenth to twentieth aspects, the predetermined angle of the first inclined surface is determined so that the second member is not displaced with respect to the first member, when a force F is applied to the second member in a second direction from the second member toward the first member.

DETAILED DESCRIPTION

Figure 1:
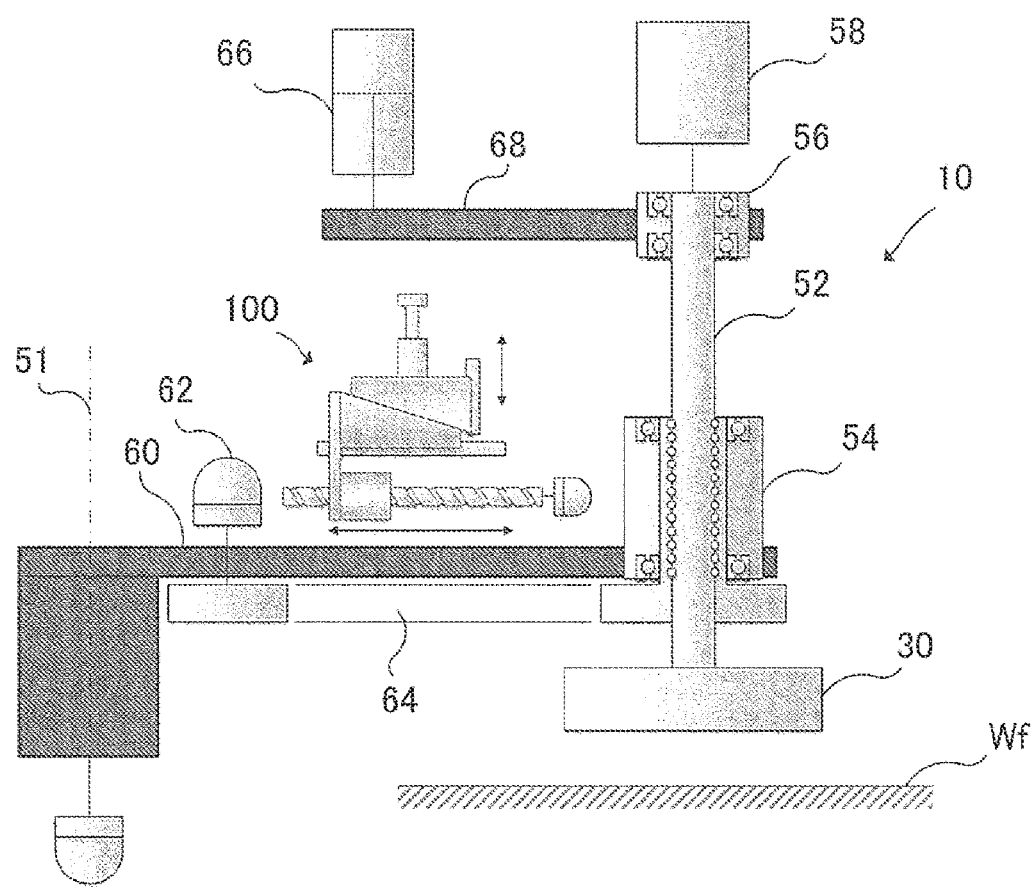
FIG. 1 is a schematic side view of a substrate processing apparatus according to an embodiment.

Hereinafter, embodiments of a head height adjustment device and a substrate processing apparatus provided with the head height adjustment device according to the present invention will be described together with the accompanying drawings. In the attached drawings, identical or similar elements are assigned identical or similar reference numerals, and duplicate description relating to the identical or similar elements in the respective embodiments will be omitted. Features shown in the respective embodiments are also applicable to the other embodiments unless they are inconsistent with each other.

Figure 13:
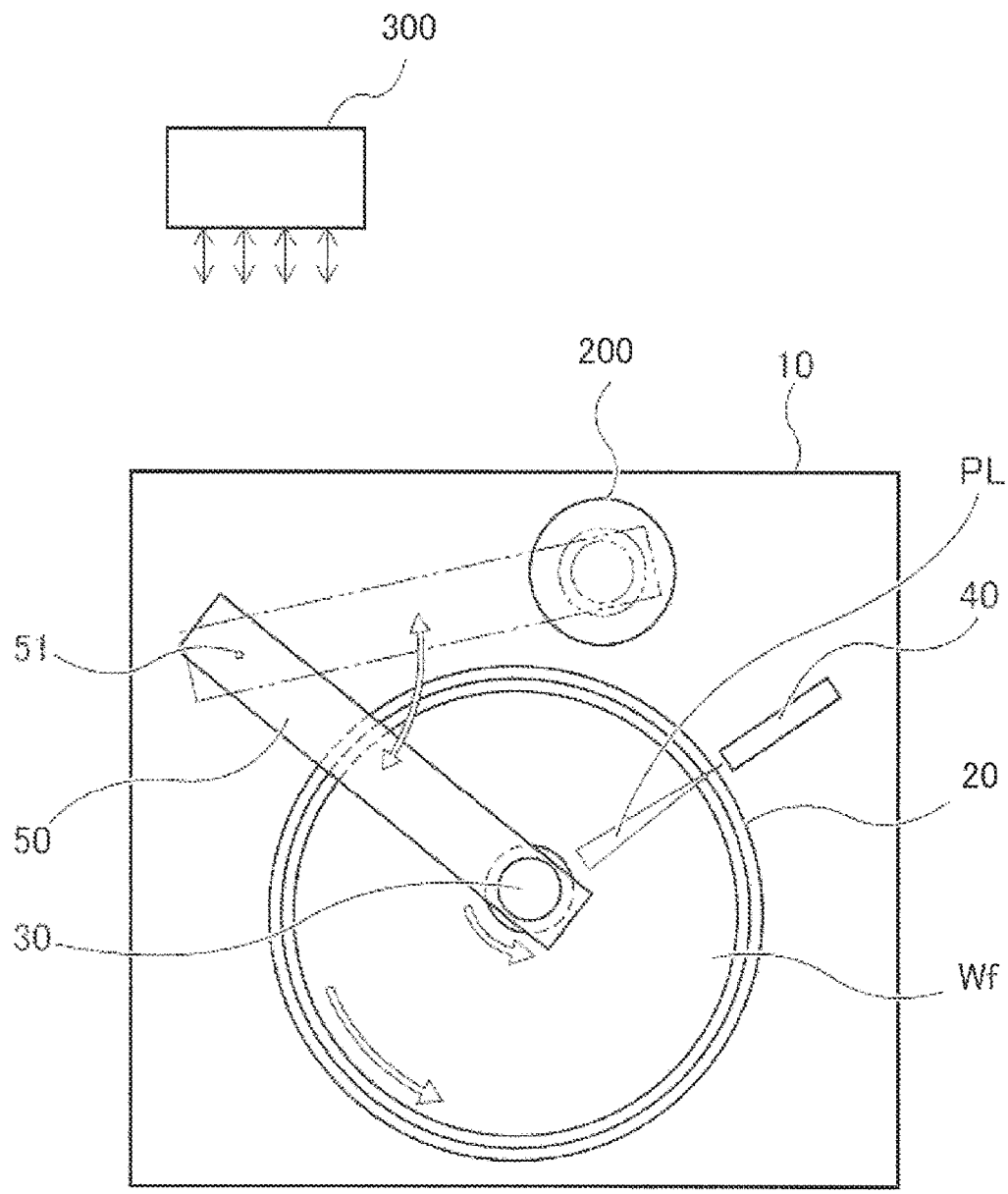
FIG. 13 is a schematic plan view of a substrate processing apparatus of a substrate processing system according to an embodiment.

FIG. 13 is a schematic plan view of a substrate processing apparatus 10 of a substrate processing system as an embodiment. The substrate processing apparatus 10 is an apparatus that performs etching processing on a semiconductor material (region to be processed) on a substrate using a CARE method. Alternatively, the substrate processing apparatus 10 can also be configured as a CMP apparatus using a pad smaller in size than the substrate. The substrate processing system is provided with the substrate processing apparatus 10, a substrate cleaning section configured to clean the substrate and a substrate conveying section that conveys the substrate. The substrate processing system may also be provided with a substrate drying section (not shown) as required. The substrate conveying section is configured to be able to convey a wet substrate and a dry substrate separately. Furthermore, depending on the type of a semiconductor material, processing through CMP may be performed using a pad greater in size than a conventional substrate to be processed before or after the processing by the substrate processing apparatus, and therefore the substrate processing system may be further provided with a CMP apparatus. The substrate processing system may further include a film formation apparatus such as a chemical vapor deposition (CVD) apparatus, a sputtering apparatus, a plating apparatus and a coater apparatus. In the present embodiment, the substrate processing apparatus 10 is configured as a unit formed separately from the CMP apparatus. Since the substrate cleaning section, the substrate conveying section and the CMP apparatus are known techniques, illustration and description thereof are omitted hereinafter.

The substrate processing apparatus 10 is provided with a table 20 to hold a substrate, a head 30 provided with a pad that holds a catalyst, a processing liquid supply section 40, a swing arm 50, a conditioning section 200 and a control section 300. The table 20 is provided with a substrate holding surface and configured to hold a wafer Wf as a kind of substrate on the substrate holding surface. In the present embodiment, the table 20 holds the wafer Wf such that a surface to be processed of the wafer Wf faces up. In the present embodiment, the table 20 is provided with a vacuum suction mechanism including a vacuum suction plate to vacuum-suction the reverse side (surface opposite to the surface to be processed) of the wafer Wf as a mechanism to hold the wafer Wf. As a vacuum suction scheme, either one of the two schemes may be used: a point suction scheme using a suction plate including a plurality of suction holes connected to a vacuum line on the suction surface and a surface suction scheme including (e.g., concentric) grooves on the suction surface to suction the wafer through connection holes to a vacuum line provided in the grooves. Furthermore, a backing member may be stuck to the surface of the suction plate so as to suction the wafer Wf via the backing member to stabilize the suction state. However, an arbitrary publicly known mechanism can be used as the mechanism for holding the wafer Wf, and for example, a clamp mechanism that clamps the front side and the reverse side of the wafer Wf on at least one of peripheral edges of the wafer Wf or a roller chuck mechanism that holds a side face of the wafer Wf on at least one of peripheral edges of the wafer Wf may be used. Such a table 20 is configured so as to be rotatable using a drive section motor or an actuator (not shown).

The head 30 of the embodiment shown in FIG. 13 is configured to hold a catalyst at a bottom end thereof. In the present embodiment, the size of the head 30 is smaller than that of the wafer Wf. That is, when an image of the head 30 is projected toward the wafer Wf, the projected area of the head 30 is smaller than the area of the wafer Wf. Furthermore, the head 30 is configured to be rotatable by a drive section, that is, an actuator (not shown). Furthermore, the swing arm 50 is provided with a motor or an air cylinder (not shown) so as to bring the catalyst of the head 30 into sliding contact with the wafer Wf. Next, the processing liquid supply section 40 is configured to supply a processing liquid PL to the surface of the wafer Wf. Here, the number of processing liquid supply sections 40 is one in FIG. 13, but a plurality of processing liquid supply sections 40 may be arranged, and in that case, different processing liquids may be supplied from the respective processing liquid supply sections. When the surface of the wafer Wf is cleaned in the substrate processing apparatus 10 after etching processing, a cleaning chemical solution or water may be supplied from the processing liquid supply section 40. As another embodiment, the processing liquid supply section 40 may be configured to supply the processing liquid PL from the surface of the head 30 to the surface of the wafer Wf after passing through the swing arm 50 and the head 30.

The swing arm 50 is configured to be swingable around a center of rotation 51 by a drive section, that is, an actuator (not shown). Furthermore, the head 30 is configured to be movable upward or downward and able to push the head 30 against the wafer Wf. The head 30 is rotatably attached at a distal end of the swing arm 50 (end portion on a side opposite to the center of rotation 51).

FIG. 1 is a schematic side view of the substrate processing apparatus 10 according to an embodiment. As shown in FIG. 1, the head 30 is connected to a shaft 52. The shaft 52 is rotatably supported to a ball spline 54, a slip ring 56, and a rotary joint 58. The ball spline 54 is connected to a base 60. Note that a rotary connector may also be used instead of the slip ring 56 or non-contact electric connection may be implemented. The head 30 may be rotated by a rotary motor 62 via a belt 64. The shaft 52 is driven by an air cylinder 66 in an axial direction. An air bearing cylinder may be used for the air cylinder 66. Use of the air bearing cylinder can reduce sliding resistance and also reduce hysteresis. The air cylinder 66 is connected to the shaft 52 via a lifting member 68 connected to the air cylinder 66. Therefore, the air cylinder 66 can change the height of the head 30 with respect to the wafer Wf. Note that although not shown in FIG. 1, for clarification of illustration, the substrate processing apparatus 10 includes processing liquid supply passages in the shaft 52 and the head 30 so as to be able to supply a processing liquid PL and/or water from the surface of the head 30. Alternatively, the processing liquid PL and/or water may also be supplied by the processing liquid supply section 40 shown in FIG. 13 from the outside of the head 30.

The substrate processing apparatus 10 shown in FIG. 1 is provided with a mechanical stopper device 100 to define a stop position of the lifting member 68 moved by the air cylinder 66. The mechanical stopper device 100 contacts the lifting member 68 to define the stop positions of the lifting member 68 and the head 30. The mechanical stopper device 100 is disposed at a position on a movement track of the lifting member 68, that is, between the lifting member 68 and the base 60 so as to be able to stop the movement of the lifting member 68 midway through. Furthermore, the mechanical stopper device 100 is connected and fixed to the base 60.

Figure 2:
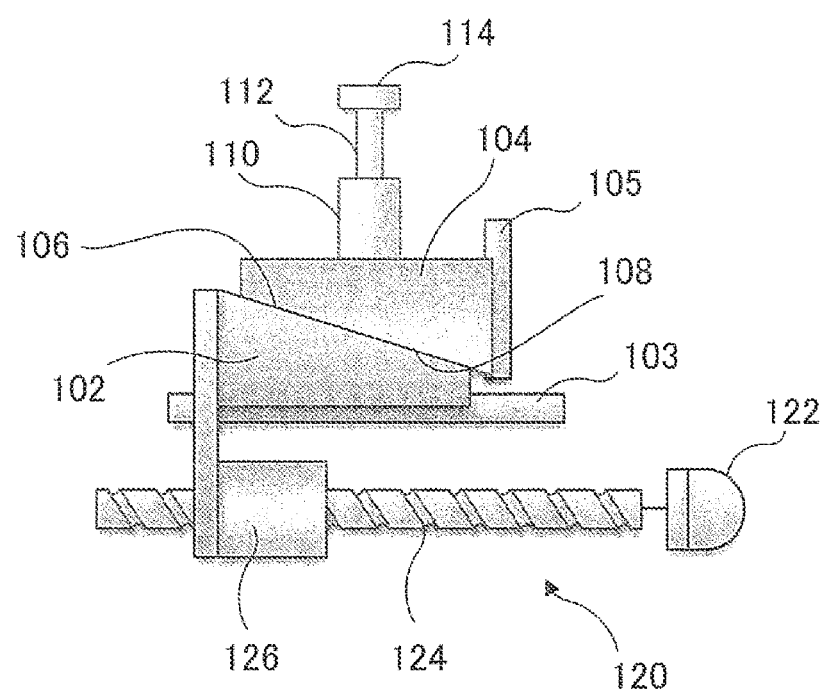
FIG. 2 is a side view schematically illustrating a structure of the mechanical stopper device shown in FIG. 1.
Figure 3:
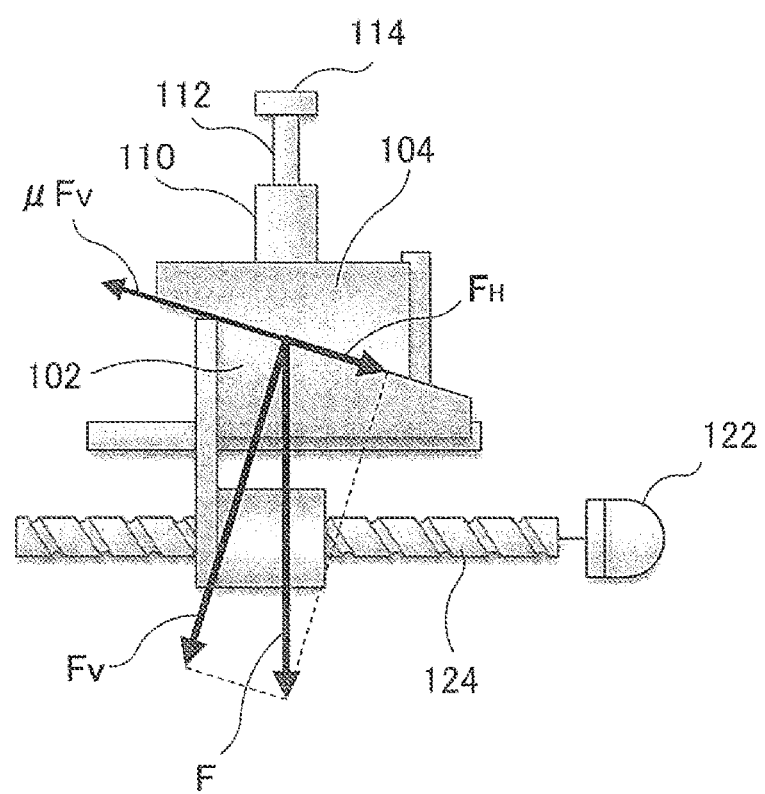
FIG. 3 is a side view illustrating the mechanical stopper device when a stop position is changed from the state shown in FIG. 2.

FIG. 2 is a side view schematically illustrating a structure of the mechanical stopper device 100 shown in FIG. 1. FIG. 3 is a side view illustrating the mechanical stopper device 100 whose stop position is changed from the state in FIG. 2. As shown in FIGS. 2 and 3, the mechanical stopper device 100 includes a first wedge-shaped member 102 and a second wedge-shaped member 104. The mechanical stopper device 100 includes a ball screw 120 connected to the first wedge-shaped member 102 and a motor 122 to drive the ball screw 120. The first wedge-shaped member 102 is provided with a first inclined surface 106 that forms a predetermined angle with respect to a direction of a screw shaft 124 of the ball screw 120. The first wedge-shaped member 102 can move in a direction parallel to the screw shaft 124 by guide means 103 fixed to the base 60. The second wedge-shaped member 104 is provided with a second inclined surface 108 slidably contacting the first inclined surface 106. The first wedge-shaped member 102 is connected to a nut 126 of the ball screw 120. The second wedge-shaped member 104 can move in a direction perpendicular to the screw shaft 124 by guide means 105 fixed to the base 60.

The second wedge-shaped member 104 includes a screw receiving part 110. A bolt 112 engages with the screw receiving part 110. The bolt 112 extends in a direction perpendicular to the surface of the wafer Wf. A head 114 of the bolt 112 is configured to be contactable with the lifting member 68 to define the stop position of the lifting member 68. By rotating the bolt 112, it is possible to adjust the height of the head 114 of the bolt 112 with respect to the screw receiving part 110 and thereby manually adjust the stop position of the lifting member 68.

When the motor 122 causes the screw shaft 124 to rotate, the nut 126 moves along the screw shaft 124. Thus, the first wedge-shaped member 102 connected to the nut 126 also moves in the direction of the screw shaft 124. As the first wedge-shaped member 102 moves, the second wedge-shaped member 104 can move in a direction perpendicular to the screw shaft 124 by means of the second inclined surface 108 that slidably engages with the first inclined surface 106 of the first wedge-shaped member 102 (see FIG. 2 and FIG. 3). Therefore, the air cylinder 66 can adjust the stop position when moving the lifting member 68 and can, by extension, adjust the stop position of the head 30 with respect to the surface of the wafer Wf.

The mechanical stopper device 100 according to the present embodiment converts a displacement in a horizontal direction of the ball screw 120 to a displacement in a height direction. Therefore, even when there is no space for providing a ball screw in the height direction (direction perpendicular to the surface of the wafer Wf) in the swing arm 50, if there is a space for disposing the ball screw in the horizontal direction (direction parallel to the surface of the wafer Wf), the mechanical stopper device can be disposed. Furthermore, since a displacement in the horizontal direction is converted to that in a height direction by an angle of inclination of the first inclined surface 106 and the second inclined surface 108, it is possible to perform position adjustment in the height direction more finely than the moving pitch of the ball screw 120 in the horizontal direction. Furthermore, when a downward force F is given to the second wedge-shaped member 104 from the air cylinder 66 via the bolt 112 (see FIG. 3), it is possible to support a pushing load from the air cylinder 66 without imposing any load on a brake of the motor 122 by selecting angles of the inclined surfaces 106 and 108 so as to satisfy $\mu F_v \geq F_H$, where $\mu$ is a still frictional coefficient between the first inclined surface 106 and the second inclined surface 108, $F_v$ is a component in a direction perpendicular to the inclined surfaces 106 and 108 of the force F, and $F_H$ is a component in a direction parallel thereto. When adjusting the stop position of the head 30 using the mechanical stopper device 100, it is possible to manually adjust the stop position using the bolt 112 to a certain degree and then more finely adjust the stop position of the head 30 using the ball screw 120.

Figure 4A:
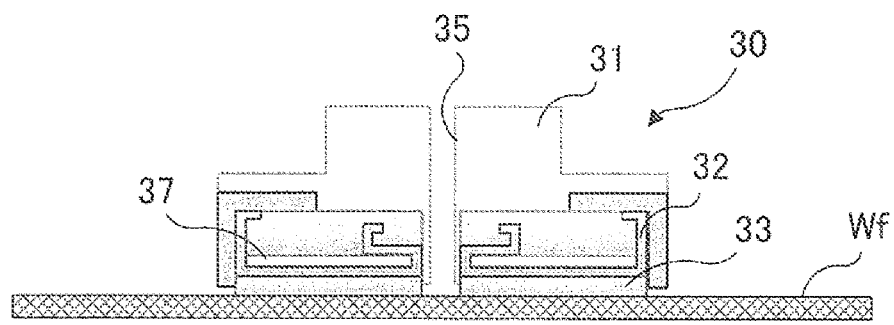
FIG. 4A is a side view schematically illustrating a structure of a head according to an embodiment.
Figure 4B:
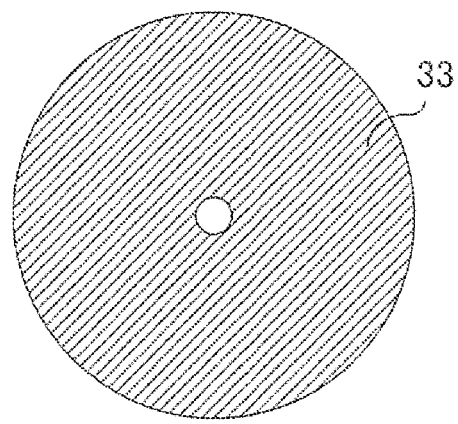
FIG. 4B is a diagram of the head shown in FIG. 4A seen from below, and is a diagram illustrating a contact region between a pad and a wafer Wf.

FIG. 4A is a side view schematically illustrating a structure of the head 30 according to an embodiment. FIG. 4B is a diagram illustrating the head 30 shown in FIG. 4A seen from below, showing a contact region between the pad 33 and the wafer Wf. The head 30 shown in FIG. 4A includes a head body 31. The head body 31 is connected to the shaft 52 (see FIG. 1). A bag-shaped airbag 32 is attached to the head body 31. A fluid storing chamber 37 that stores a gas is defined inside the airbag 32 and it is possible to supply or discharge the gas (e.g., air or nitrogen) to/from the fluid storing chamber 37 through a gas supply channel (not shown). The undersurface of the airbag 32 is formed so as to be flat when no gas is supplied. A pad 33 is attached to the undersurface of the airbag 32. Parts other than the undersurface of the airbag 32 are fixed by the head body 31 or other members and only the undersurface of the airbag 32 swells when the gas is supplied. The pad 33 can be attached to the airbag 32 using, for example, a double-sided tape or adhesive. The pad 33 can be a pad to which a catalyst for CARE is added. Alternatively, the pad 33 can also be a pad for CMP. In the head 30 shown in FIG. 4A, a processing liquid passage 35 for passing the processing liquid PL is formed at the center, which allows the processing liquid PL to be supplied from the center of the pad 33.

In the head 30 shown in FIG. 4A, it is possible to adjust the contact pressure between the wafer Wf to be processed and the pad 33 by the pressure of a gas supplied to the airbag 32. For example, the mechanical stopper device 100 adjusts the lowest point of a descending position of the head 30 to a position at which the head 30 comes into contact with the wafer Wf at a zero pressure or to a position at which the head 30 nearly comes into contact with the wafer Wf, and can thereby adjust the contact pressure between the head 30 and the wafer Wf by the pressure of the gas supplied to the airbag 32.

Figure 5A:
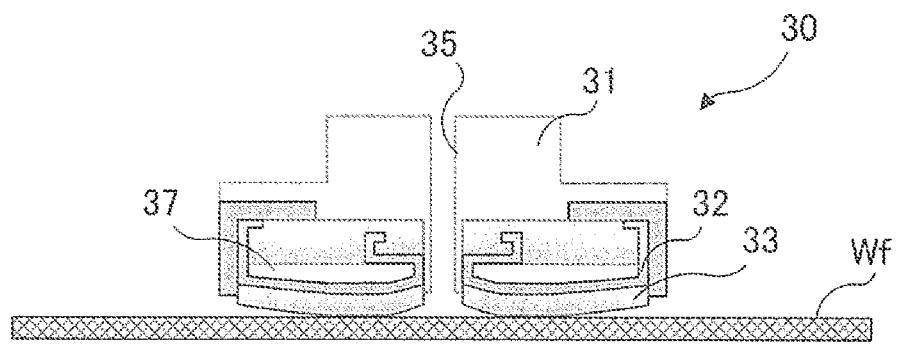
FIG. 5A is a side view schematically illustrating a structure of the head according to an embodiment, and is a diagram illustrating a state in which a gas is supplied to an airbag.
Figure 5B:
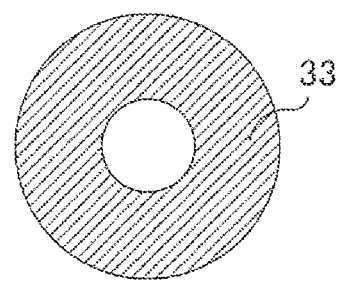
FIG. 5B illustrates the contact region between the pad and the wafer Wf in the state shown in FIG. 5A.

The contact area between the pad 33 and the wafer Wf can also be adjusted according to the amount of gas supplied to the airbag 32. FIG. 4A illustrates a state in which no gas is supplied to the airbag 32 and FIG. 4B illustrates a contact region between the pad 33 and the wafer Wf. In the examples of FIGS. 4A and 4B, since no gas is supplied to the airbag 32, the surface of the pad 33 is flat and the entire surface of the pad 33 is in contact with the wafer Wf. On the other hand, FIG. 5A illustrates a state in which a gas is supplied to the airbag 32. FIG. 5B illustrates the contact region between the pad 33 and the wafer Wf in the state shown in FIG. 5A. As illustrated in FIG. 5A, the airbag 32 is swollen with the gas so that the surface of the pad 33 becomes convex downward. For this reason, as shown in FIG. 5B, the contact area between the pad 33 and the wafer Wf becomes smaller than in the case shown in FIGS. 4A and 4B. By reducing the contact area between the pad 33 and the wafer Wf, it is possible to more locally process the surface of the wafer Wf. In this way, it is possible to adjust the contact area between the pad 33 and the wafer Wf by adjusting the lowest point of the descending position of the head 30 and the amount of gas supplied to the airbag 32.

Figure 6:
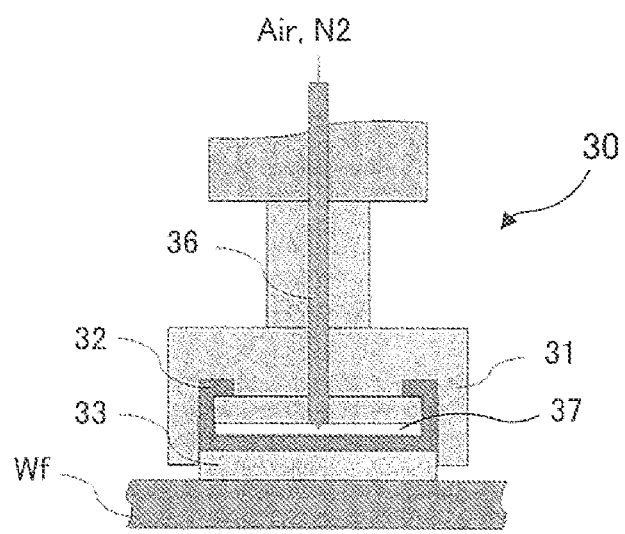
FIG. 6 is a side view schematically illustrating the structure of the head according to an embodiment.

FIG. 6 is a side view schematically illustrating a structure of the head 30 according to an embodiment. The head 30 shown in FIG. 6 includes the head body 31. The head body 31 is connected to the shaft 52 (see FIG. 1). The airbag 32 is attached to the head body 31. The fluid storing chamber 37 to store a gas is defined inside the airbag 32 and the gas (e.g., air or nitrogen) can be supplied or discharged to/from the fluid storing chamber 37 through the gas supply channel 36. The pad 33 is attached to the airbag 32. The pad 33 can be attached to the airbag 32 using, for example, a double-sided tape or adhesive. The pad 33 can be a pad to which a catalyst for CARE is added. Alternatively, the pad 33 can also be a pad for CMP.

Figure 7:
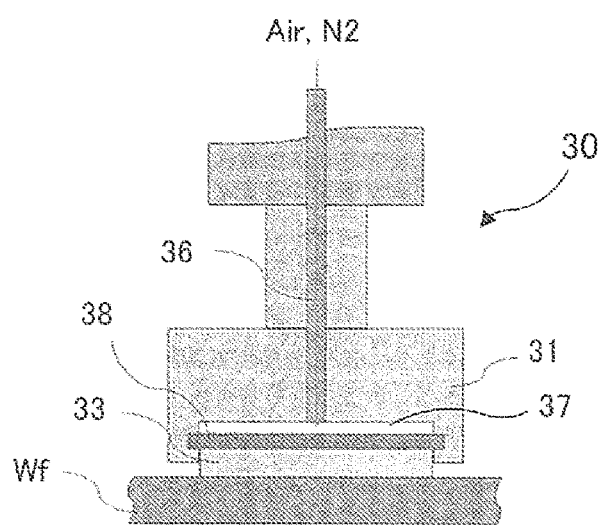
FIG. 7 is a side view schematically illustrating the structure of the head according to an embodiment.

FIG. 7 is a side view schematically illustrating a structure of the head 30 according to an embodiment. The head 30 shown in FIG. 7 includes the head body 31. The head body 31 is connected to the shaft 52 (see FIG. 1). The fluid storing chamber 37 for storing a gas is defined in the head body 31. The bottom surface of the fluid storing chamber 37 is formed of an elastic film 38. For this reason, when the gas is supplied to the fluid storing chamber 37, the elastic film 38 is elastically deformed. The pad 33 is attached to the underside of the elastic film 38. The pad 33 can be attached to the elastic film 38 using, for example, a double-sided tape or adhesive. The pad 33 can be a pad to which a catalyst for CARE is added. Alternatively, the pad 33 can also be a pad for CMP. The head 30 in FIG. 6 and FIG. 7 has effects similar to those of the head 30 of the embodiments shown in FIGS. 4 and 5.

Figure 8:
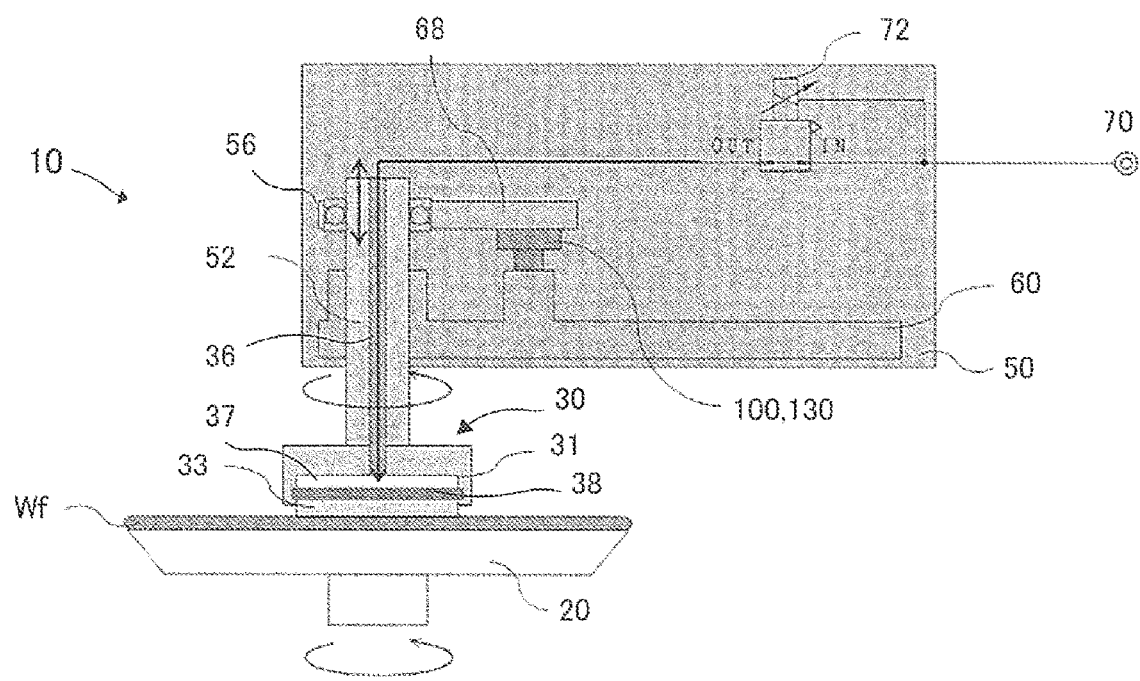
FIG. 8 is a side view schematically illustrating a configuration of a substrate processing apparatus according to an embodiment.

FIG. 8 is a side view schematically illustrating a configuration of the substrate processing apparatus 10 according to an embodiment. The substrate processing apparatus 10 shown in FIG. 8 uses the head 30 shown in FIG. 7. The substrate processing apparatus 10 in FIG. 8 includes a rotatable table 20 that holds the wafer Wf. The head 30 is rotatably attached to the shaft 52. The gas supply channel 36 for supplying a gas to the fluid storing chamber 37 of the head 30 is formed at the center of the shaft 52 and the head 30. The gas supply channel 36 is connected to a gas supply source 70 and the amount of gas supplied to the fluid storing chamber 37 is controlled by an electropneumatic regulator 72. The substrate processing apparatus 10 in FIG. 8 is provided with the mechanical stopper device 100 for adjusting the descending position of the head 30. In the substrate processing apparatus 10 in FIG. 8, stop positions of the lifting member 68 and the head 30 are defined by a bolt 130 screwed into the base 60 of the swing arm 50. That is, by changing the screwing position of the bolt 130, the stop positions of the lifting member 68 and the head 30 can be changed. However, in the substrate processing apparatus 10 in FIG. 8, the mechanical stopper device 100 described in FIG. 1 to FIG. 3 may be used instead of the bolt 130.

Figure 14:
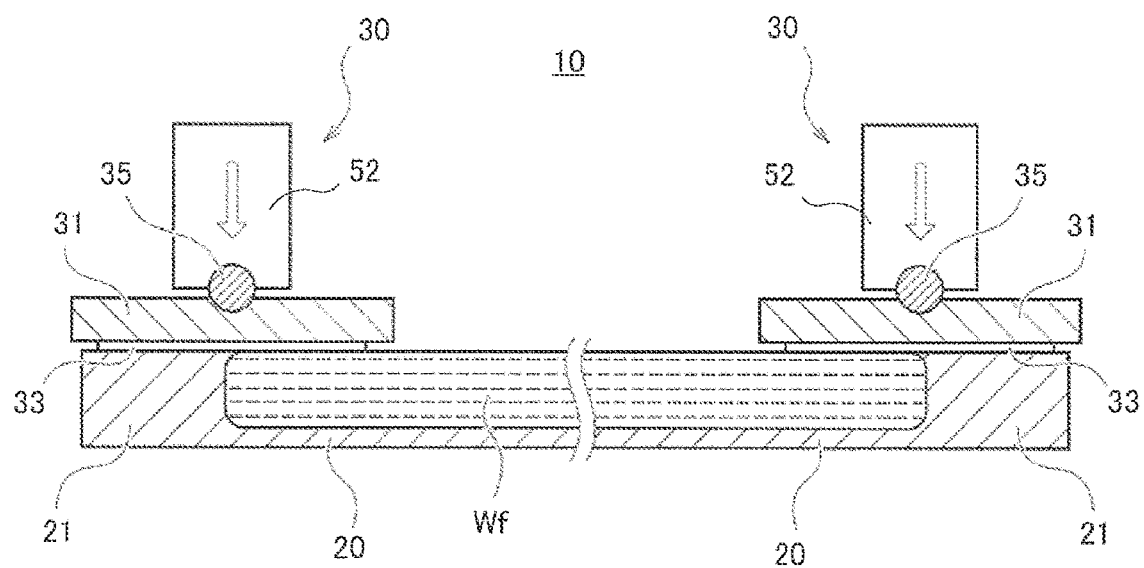
FIG. 14 is a side view schematically illustrating a configuration of a substrate processing apparatus according to an embodiment.

FIG. 14 is a side view schematically illustrating a configuration of the substrate processing apparatus 10 according to an embodiment. As shown in FIG. 14, the substrate processing apparatus 10 includes the table 20 for storing the wafer Wf. In the illustrated embodiment, the surface of the table 20 holding the wafer Wf has a greater area than the area of the surface of the pad 33 attached to the head 30. In the case of a substrate processing apparatus that processes the wafer W by swinging the pad 33 which has a smaller radius than the wafer Wf to be processed on the wafer Wf, the pad 33 may swing (overhang) beyond an outer circumference of the wafer Wf. When the pad 33 overhangs from the wafer Wf, if there is no structure for supporting the pad 33 outside the wafer Wf, the head 30 that holds the pad 33 may incline with respect to the surface of the wafer Wf. Particularly when the head 30 is connected to the shaft 52 via a Gimbal mechanism such as a spherical slide bearing 35 as shown in FIG. 14, the head 30 is likely to incline. When the pad 33 overhangs on the wafer, a contact pressure is concentrated in the vicinity of the edge of the wafer Wf. When the surface of the pad 33 is not parallel to the surface to be processed of the wafer Wf, a contact pressure distribution between the pad 33 and the wafer Wf becomes non-uniform, and in-plane uniformity of the processing speed of the surface of the wafer Wf deteriorates. Particularly when the pad 33 overhangs on the wafer Wf, the pad 33 may incline considerably and it may be impossible to keep in-plane uniformity of the processing speed of the wafer Wf. Thus, in the embodiment shown in FIG. 14, when the wafer Wf to be processed is placed on the table 20, the table 20 is provided with an extension part 21 located outside the outer circumference of the wafer Wf. The size in the radius direction of such an extension part 21 is arbitrary but is preferably equal to or greater than the radius of the pad 33.

Figure 15:
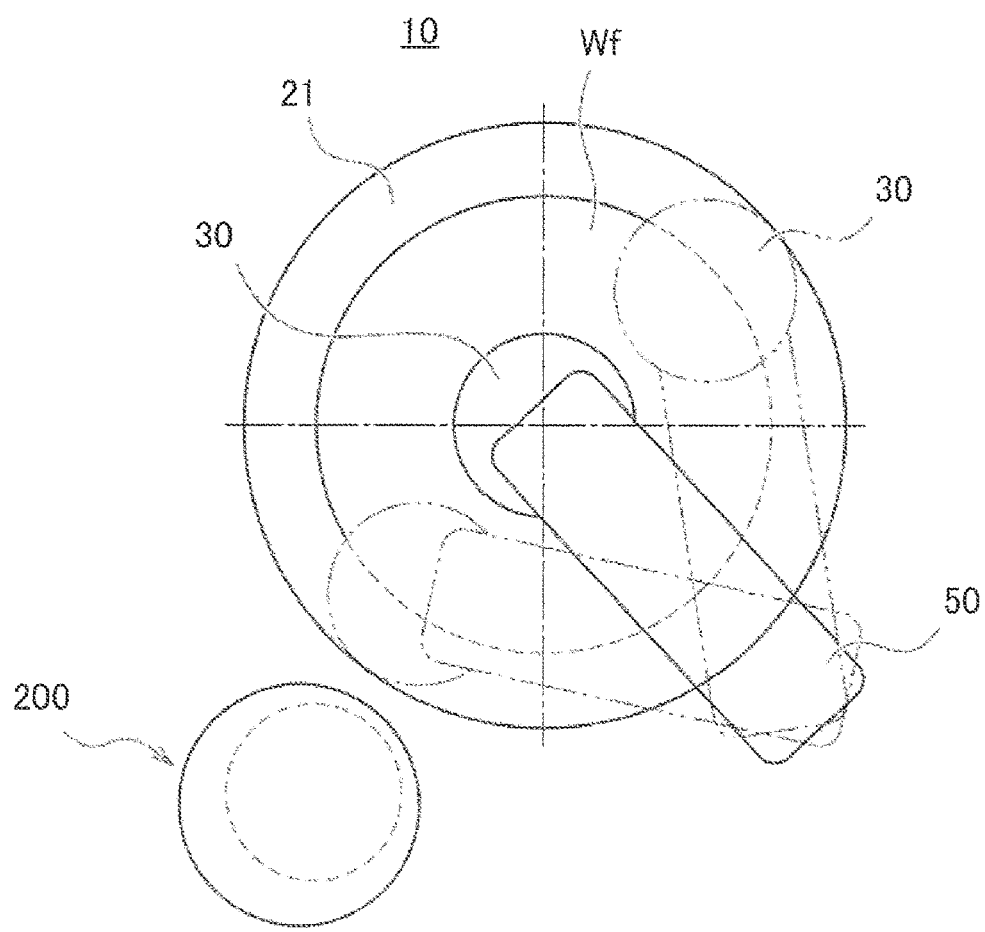
FIG. 15 is a top view of the substrate processing apparatus shown in FIG. 14.

FIG. 15 is a top view of the substrate processing apparatus 10 shown in FIG. 14. As an embodiment, the extension part 21 of the table 20 can have a structure integral with the table 20. As illustrated in FIG. 15, the extension part 21 can be provided on the entire outer circumference of the table 20. Note that in the embodiment shown in FIG. 15, the extension part 21 has a structure integral with the table 20, but as another embodiment, the table 20 and the extension part 21 may also be configured as independent structures. In such a case, the height of the extension part 21 is preferably adjustable independently of the table.

Figure 16:
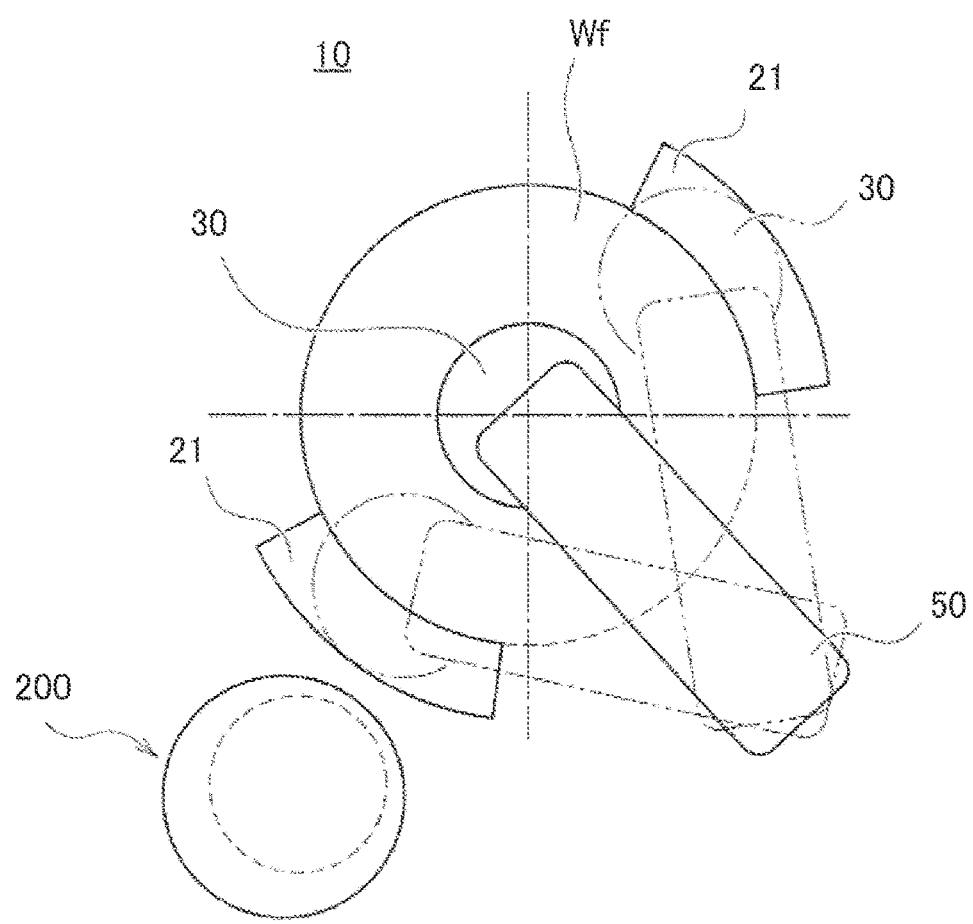
FIG. 16 is a top view schematically illustrating a substrate processing apparatus according to an embodiment.

FIG. 16 is a top view schematically illustrating the substrate processing apparatus 10 according to an embodiment. As shown in FIG. 16, the extension part 21 of the table 20 has a structure independent of the table 20. Thus, while the table 20 is rotatable, the extension part 21 is fixed to the substrate processing apparatus 10. With such a configuration, it is possible to reduce the area of the extension part 21 compared to the case of the embodiment shown in FIG. 15 and efficiently make the most of the entire space of the substrate processing apparatus 10. Furthermore, the extension part 21 can be configured so that its height can be adjusted independently of the table 20.

As shown in FIG. 14 to FIG. 16, in the embodiments provided with the extension part 21 of the table 20, even when the pad 33 is made to overhang on the wafer surface, the pad 33 is supported by the extension part 21. Therefore, the pad 33 can keep its state of contact constant with respect to the wafer Wf (e.g., distribution of contact pressure), and as a result, it is possible to enhance in-plane uniformity of the processing speed of the wafer Wf.

Note that a conditioning section 200 may be disposed on the extension part 21 of the table 20. Adoption of such a configuration makes it possible to efficiently make the most of the entire space of the substrate processing apparatus 10.

Figure 9:
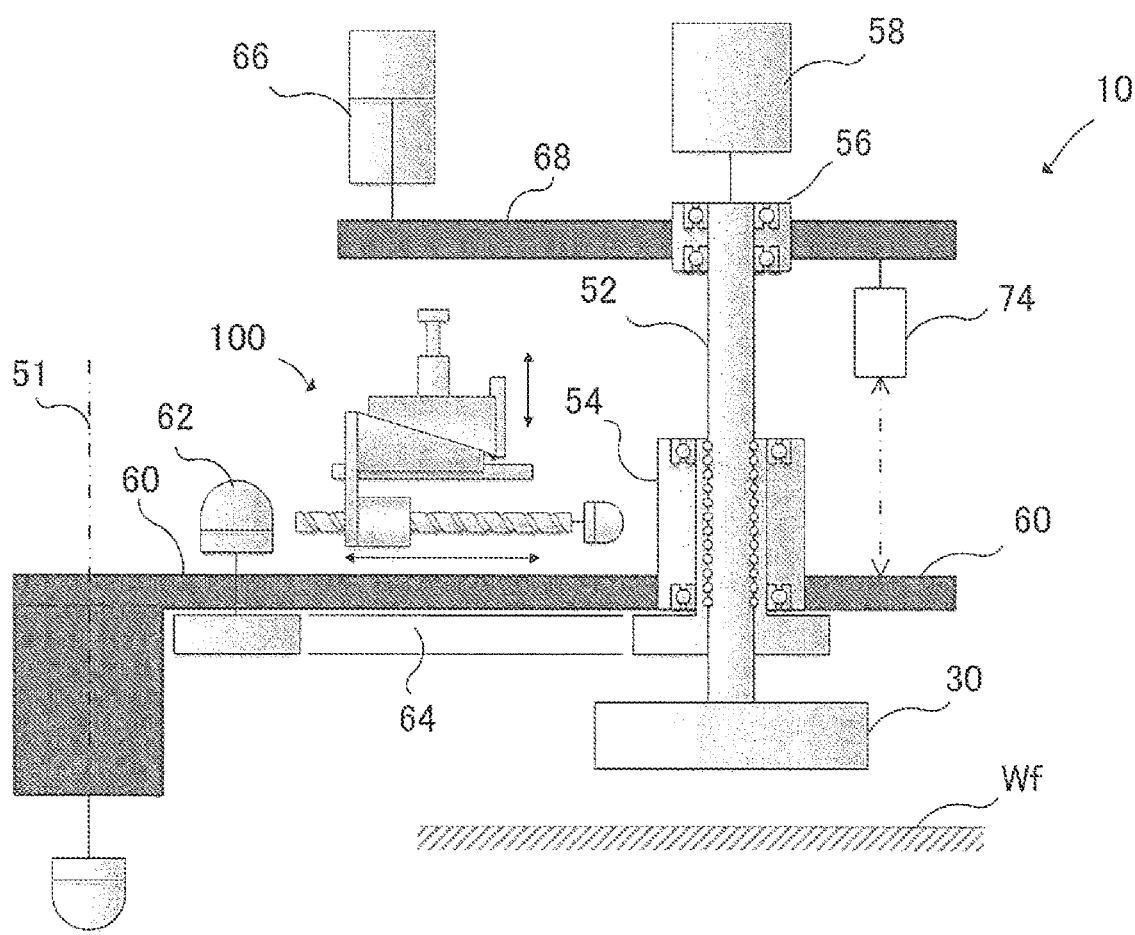
FIG. 9 is a side view schematically illustrating a configuration of a substrate processing apparatus according to an embodiment.

FIG. 9 is a side view schematically illustrating a configuration of the substrate processing apparatus 10 according to an embodiment. The substrate processing apparatus 10 in FIG. 9 has a configuration with a displacement sensor 74 added to the substrate processing apparatus 10 shown in FIG. 1. In the substrate processing apparatus 10 according to the present embodiment, the displacement sensor 74 is attached to the lifting member 68, and can measure a distance between the lifting member 68 and the base 60. Since the distance between the table 20 on which the wafer Wf is placed and the base 60 is constant, it is possible to determine the distance between the head 30 and the wafer Wf by measuring the distance between the lifting member 68 and the base 60. The displacement sensor 74 can communicate with the control section 300 (see FIG. 13), and can control operation of the substrate processing apparatus 10 based on the distance between the lifting member 68 and the base 60 received from the displacement sensor 74. The type of the displacement sensor 74 can be arbitrary; it may be a non-contact type displacement sensor using a laser, eddy current, ultrasound or the like or a contact type displacement sensor.

Figure 17:
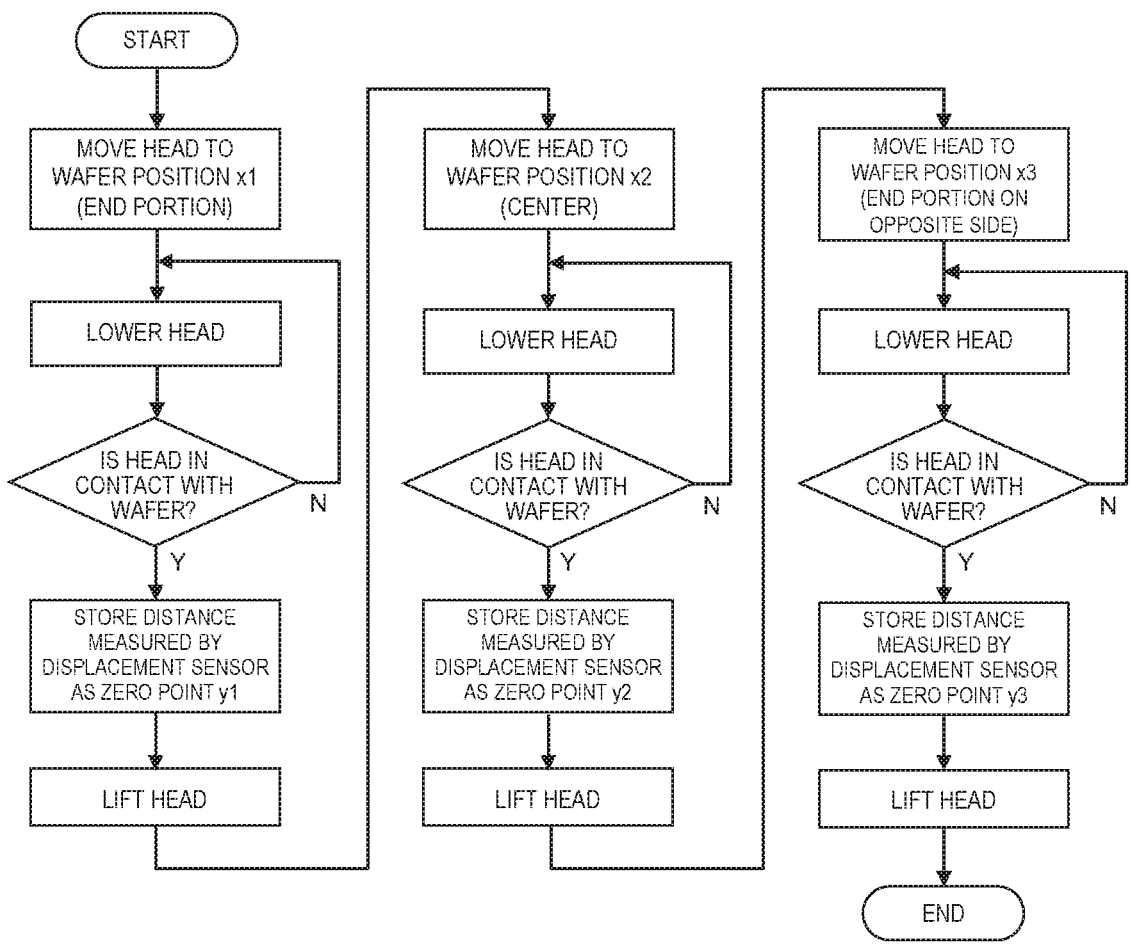
FIG. 17 is a diagram illustrating a processing flow for determining zero points of the height of the head with respect to the wafer Wf using the substrate processing apparatus 10 in FIG. 9.
Figure 18:
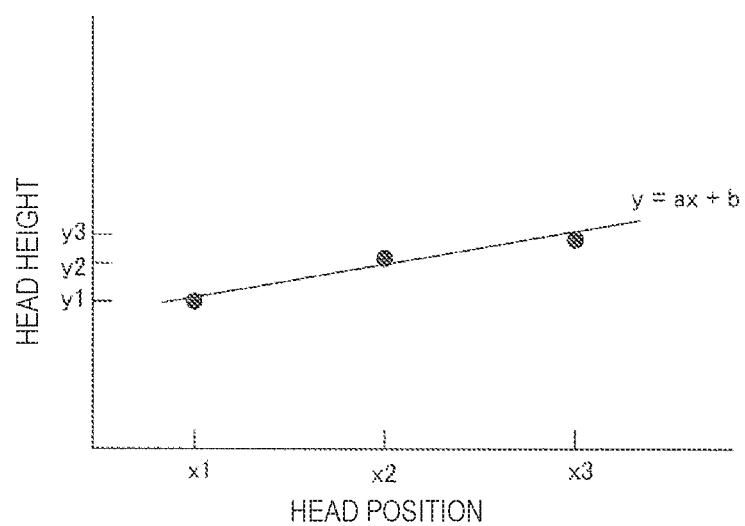
FIG. 18 is a graph schematically illustrating an example of approximate equation of zero points of the height of the head.

It is possible to adjust the height of the head 30 during the processing of the wafer Wf using the substrate processing apparatus 10 in FIG. 9. FIG. 17 is a diagram illustrating a processing flow for calculating zero points of the height of the head 30 with respect to the wafer Wf using the substrate processing apparatus 10 in FIG. 9. First, with the wafer Wf placed on the table 20, the substrate processing apparatus 10 causes the head 30 to move so that the position of the head 30 with respect to the plane direction (horizontal direction) of the wafer Wf is located in the vicinity (x1) of the end portion of the wafer Wf. The head 30 is lowered by causing the air cylinder 66 to lower the lifting member 68 down to the position at which the head 30 comes into contact with the wafer Wf. At the position at which the head 30 is in contact with the wafer Wf, a distance y1 between the lifting member 68 and the base 60 is measured using the displacement sensor 74. The control section 300 is caused to store this distance y1 as a zero point where the distance between the wafer Wf and the head 30 becomes zero. Next, the head 30 is lifted so that the position in the horizontal direction of the head 30 is in the vicinity of the center (x2) of the wafer Wf. At this position, as described above, the head 30 is lowered until it comes into contact with the wafer Wf, and a distance y2 between the lifting member 68 and the base 60 at the head position x2 is measured using the displacement sensor 74. The control section 300 is caused to store this distance y2 as a zero point at the head position x2. Next, the head 30 is lifted so that the position in the horizontal direction of the head 30 is in the vicinity of the end portion (x3) on the opposite side of the wafer Wf. At this position, the head 30 is caused to descend as described above, until it comes into contact with the wafer Wf, and a distance y3 between the lifting member 68 and the base 60 at a head position x3 is measured using the displacement sensor 74. The control section 300 is caused to store this distance y3 as a zero point at the head position x3. It is possible to obtain an approximate equation relating to zero points of the height of the head 30 with respect to the position of the wafer Wf from the zero points (y1, y2, y3) of the height of the head 30 at the respective positions in the horizontal direction (x1, x2, x3) of the head 30. FIG. 18 is a graph schematically illustrating an example of the approximate equation of zero points of the height of the head 30. In FIG. 18, the horizontal axis shows a position in the horizontal direction of the head 30 and the vertical axis shows a zero point of the height of the head 30. FIG. 18 is a graph obtained by plotting zero points of the head 30 measured using the method in FIG. 17. In FIG. 18, zero points are approximated by a linear function equation $y=ax+b$ that passes through three zero points measured as an example of the approximate equation expressing zero points. Coefficients "a" and "b" can be calculated using, for example, a least squares method. When there is a distortion in the wafer Wf or when the table 20 holding the wafer Wf is inclined, zero points differ depending on the position of the wafer Wf (e.g., position in the radius direction). As described above, by measuring and storing zero points for each position of the wafer Wf in advance, and calculating an approximate equation of the zero points, it is possible to approximately obtain a zero point with respect to an arbitrary position of the wafer Wf. By always monitoring zero points of the head 30 using the approximate equation, it is possible to perform control so as to always maintain an optimum state of contact between the head 30 and the wafer Wf according to the position in the horizontal direction of the head 30 with respect to the wafer Wf during processing of the wafer Wf. It is possible to control the state of contact between the head 30 and the wafer Wf by controlling, for example, the stop position using the mechanical stopper device 100 according to the position of the head 30 with respect to the wafer Wf during processing of the wafer Wf or controlling the amount of the gas supplied to the fluid storing chamber 37.

Figure 19:
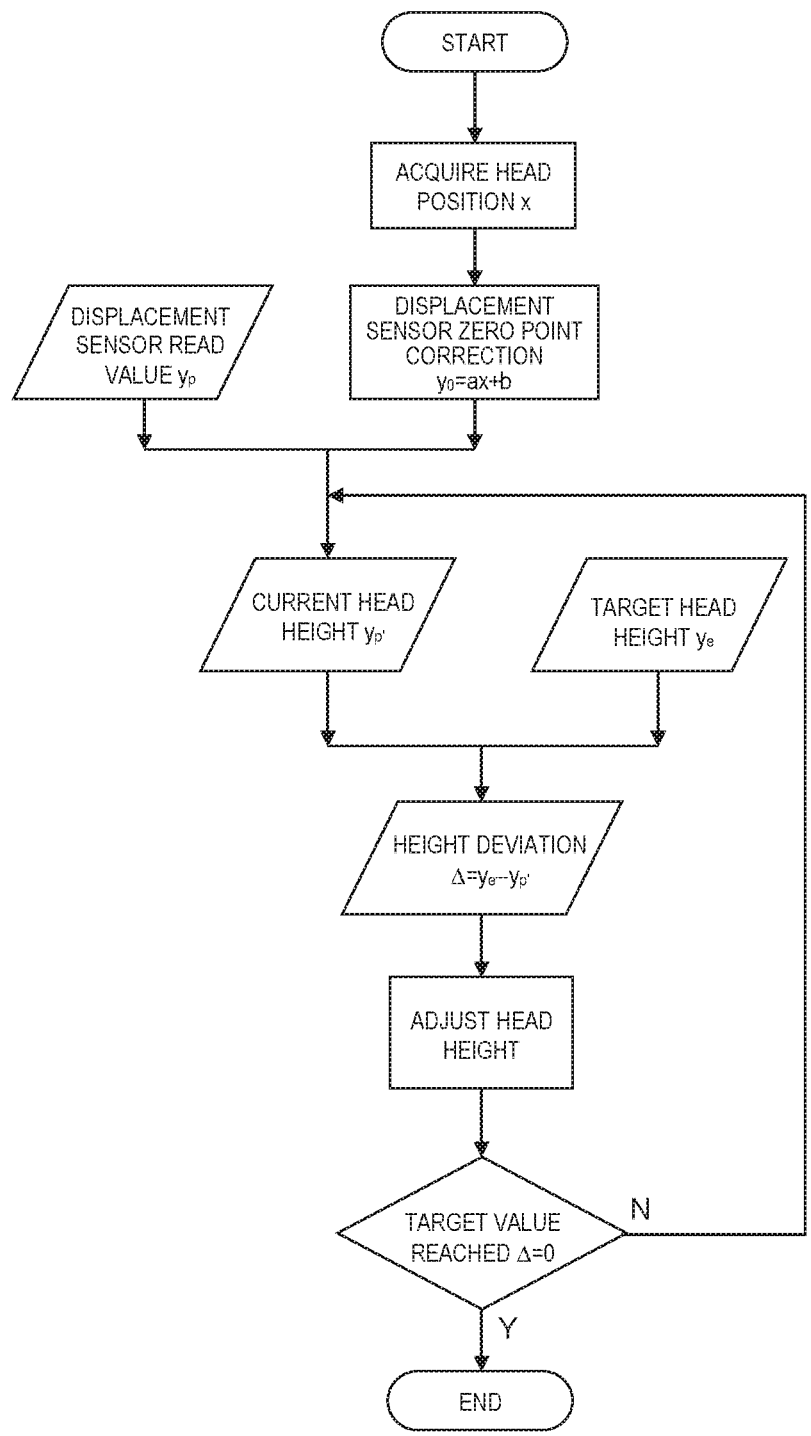
FIG. 19 is a diagram illustrating a flow for processing a wafer while performing head height control using a displacement sensor in the substrate processing apparatus shown in FIG. 9 according to the embodiment.

FIG. 19 is a diagram illustrating a flow for processing the wafer Wf while controlling the head height using the displacement sensor 74 in the substrate processing apparatus 10 according to the embodiment shown in FIG. 9. A position x in the horizontal direction of the head 30 is acquired during processing of the wafer Wf. The position x of the head 30 can be determined based on the position of the swing arm 50. A zero point of the head height at the position x of the head 30 is calculated using the aforementioned approximate equation. It is also possible to calculate a height of the head 30 (current height) $y_p'$ at the head position x from a read value $y_p$ of the displacement sensor 74 at the position x of the head 30 and the zero point of the head height. A deviation of height $\Delta = y_e - y_p'$ is calculated from the current head height and a target height $y_e$ of the head 30. The height of the head 30 is adjusted based on such a deviation of height $\Delta$. These calculations and control of the substrate processing apparatus 10 can be performed by the control section 300.

Note that when the device is provided with the extension part 21 that allows height control to be performed independently of the table 20 as in the embodiment shown in FIG. 16, the height of the extension part 21 may be adjusted based on the aforementioned approximate equation. For example, when the aforementioned approximate equation is extended to the extension part 21 and the head 30 is located on the extension part 21, the height of the extension part 21 can be adjusted so as to obtain a zero point of the head height calculated from the approximate equation. Furthermore, when the head 30 is located on the extension part 21 during processing of the wafer Wf, it is possible to control the height of the head 30 so as to maintain an optimum state of contact between the head 30 and the wafer Wf as described in FIG. 19.

Figure 10:
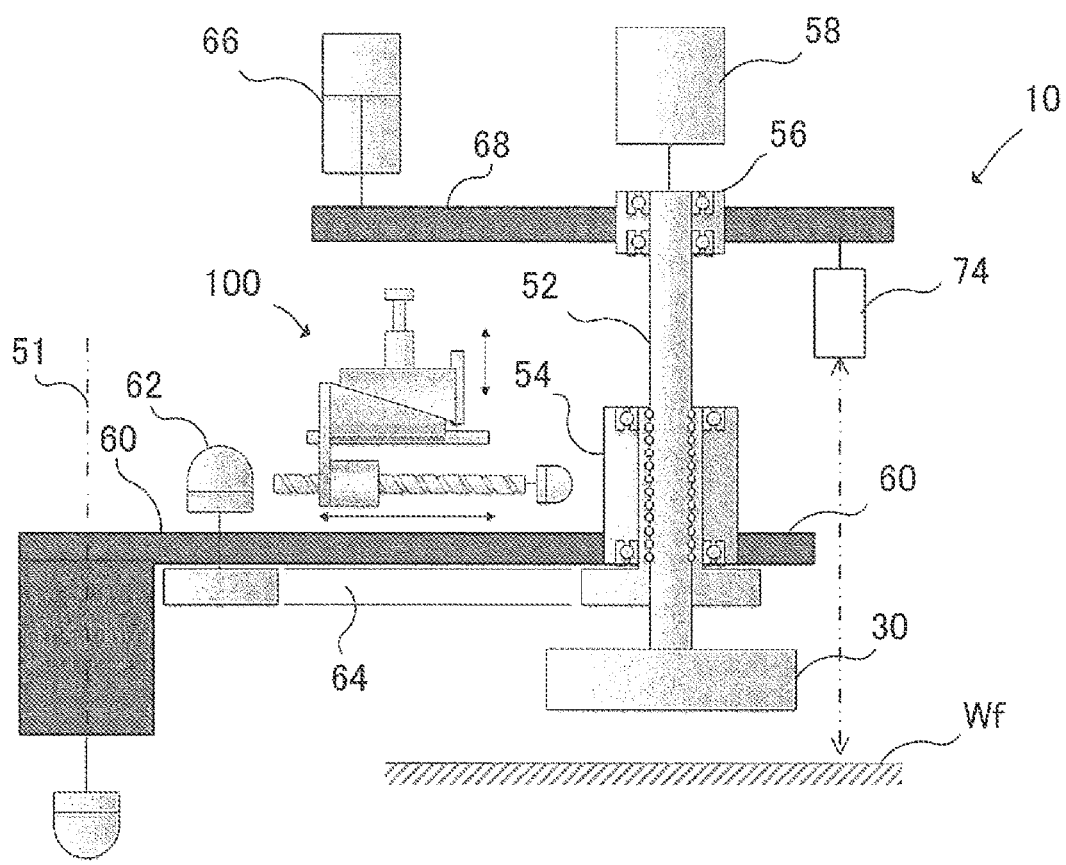
FIG. 10 is a side view schematically illustrating a configuration of a substrate processing apparatus according to an embodiment.

FIG. 10 is a side view schematically illustrating a configuration of the substrate processing apparatus 10 according to an embodiment. The substrate processing apparatus 10 in FIG. 10 has a configuration with the displacement sensor 74 added to the substrate processing apparatus 10 shown in FIG. 1. In the substrate processing apparatus 10 in FIG. 10, unlike the substrate processing apparatus 10 in FIG. 9, the displacement sensor 74 is configured to measure a distance between the lifting member 68 and the surface of the wafer Wf. In the substrate processing apparatus 10 in FIG. 10, a non-contact displacement sensor is preferably used as the displacement sensor 74 so as not to damage the surface of the wafer Wf. Control similar to that of the substrate processing apparatus 10 in FIG. 9 can also be performed on the substrate processing apparatus 10 in FIG. 10. However, in the substrate processing apparatus 10 in FIG. 10, the displacement sensor 74 measures the distance between the lifting member 68 and the wafer Wf. Therefore, by measuring a zero point of the head 30 at one point of the wafer Wf before starting the processing, it is possible to monitor a variation in the distance between the head 30 and the surface of the wafer Wf using the displacement sensor 74 during processing of the wafer Wf and control the state of contact between the head 30 and the wafer Wf.

Figure 20:
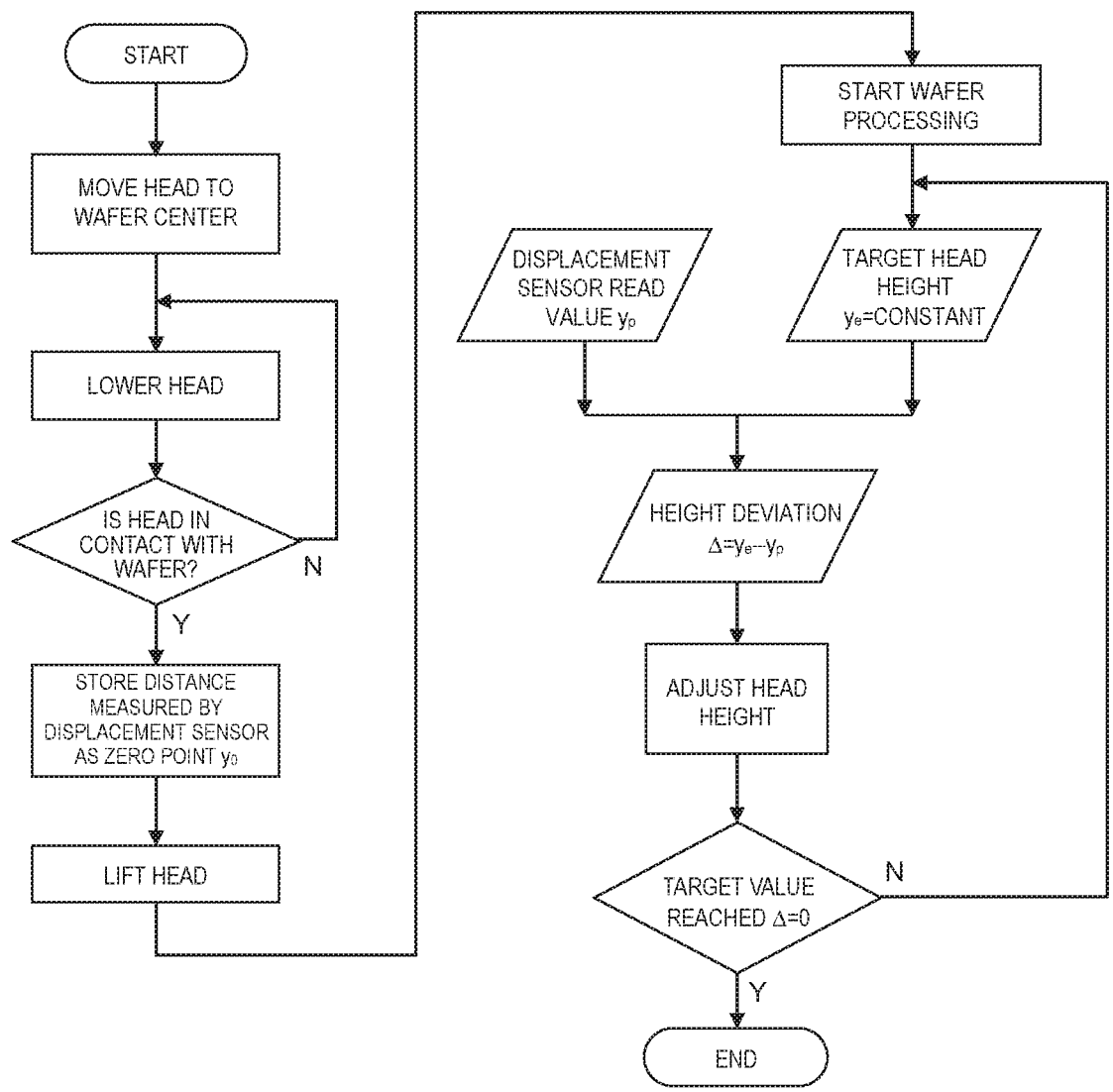
FIG. 20 is a diagram illustrating a flow for processing the wafer while performing head height control using a displacement sensor in the substrate processing apparatus shown in FIG. 10 according to the embodiment.

FIG. 20 is a diagram illustrating a flow for processing the wafer Wf while controlling the head height using the displacement sensor 74 in the substrate processing apparatus 10 according to the embodiment shown in FIG. 10. Since the displacement sensor 74 in FIG. 10 can directly measure the distance between the lifting member 68 and the wafer Wf, it is not necessary to calculate zero points according to the aforementioned approximate equation. As shown in FIG. 20, before starting the processing of the wafer Wf, the head 30 is moved to, for example, the vicinity of the center of the wafer Wf, and while keeping the head 30 in contact with the wafer Wf, the distance between the lifting member 68 and the wafer Wf is measured using the displacement sensor 74 and the control section 300 is caused to store the measured distance as a zero point $y_0$ of the height of the head 30. When the processing on the wafer Wf starts, the current height $y_p$ of the head 30 is measured using the displacement sensor 74. The current height $y_p$ of the head 30 is an amount of displacement from the zero point $y_0$ measured in advance. During processing of the wafer Wf, a deviation of $\Delta = y_e - y_p$ is calculated from the current height $y_p$ of the head and the target height $y_e$ and the head height is adjusted based on the deviation $\Delta$. These calculations and control of the substrate processing apparatus 10 can be performed by the control section 300. Furthermore, when the table 20 is provided with the extension part 21, the height of the extension part 21 may be adjusted using the displacement sensor 74 to be the same as the height of the wafer Wf on the table 20. Furthermore, even when the head 30 is located on the extension part 21 during processing of the wafer Wf, control may also be performed to obtain an optimum height of the head 30 as described above.

Figure 11:
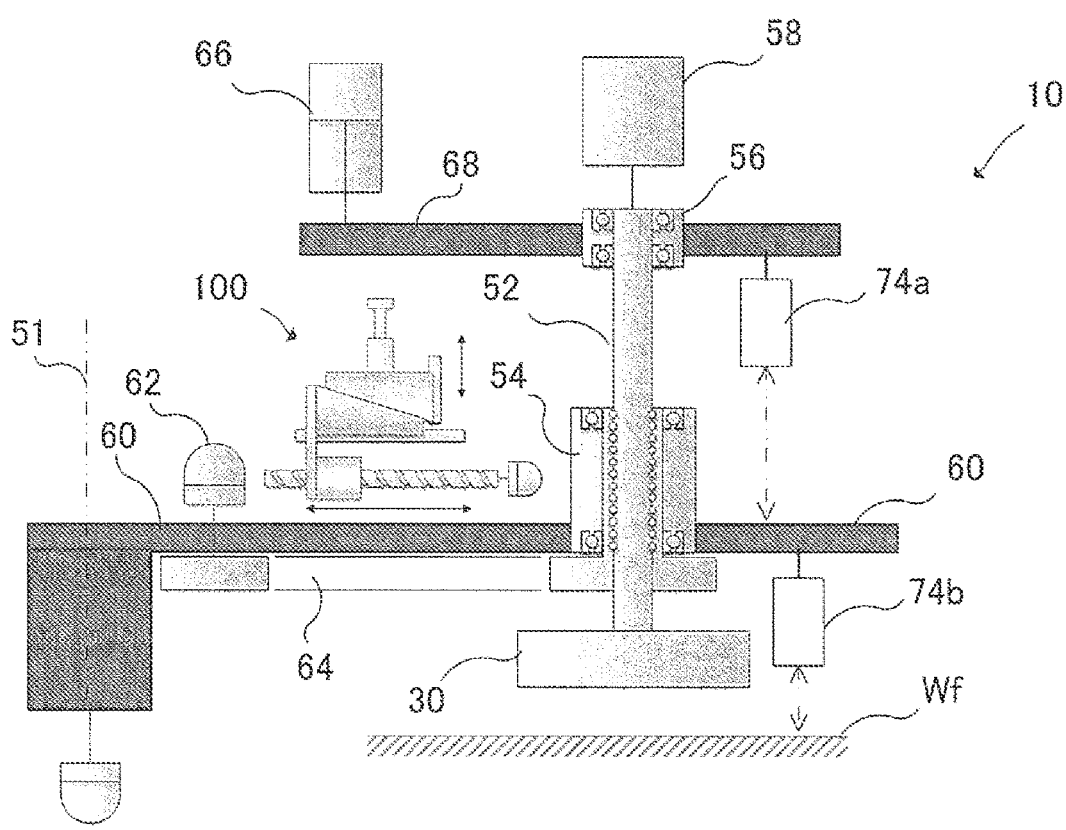
FIG. 11 is a side view schematically illustrating a configuration of a substrate processing apparatus according to an embodiment.

FIG. 11 is a side view schematically illustrating a configuration of the substrate processing apparatus 10 according to an embodiment. The substrate processing apparatus 10 in FIG. 11 has a configuration with a first displacement sensor 74a and a second displacement sensor 74b added to the substrate processing apparatus 10 shown in FIG. 1. The first displacement sensor 74a is attached to the lifting member 68 and can measure the distance between the lifting member 68 and the base 60. On the other hand, the second displacement sensor 74b is attached to the base 60 and can measure the distance between the base 60 and the surface of the wafer Wf. Either a contact or a non-contact displacement sensor may be used as the first displacement sensor 74a. A non-contact displacement sensor is preferably used as the second displacement sensor 74b to avoid damage to the surface of the wafer Wf.

It is possible to change the height of the head 30 during processing of the wafer Wf using the substrate processing apparatus 10 in FIG. 11. First, before starting processing using the substrate processing apparatus 10 in FIG. 11, the air cylinder 66 is caused to move the lifting member 68 down to the position at which the head 30 comes into contact with the wafer Wf. At the position at which the head 30 comes into contact with the wafer Wf, the distance between the lifting member 68 and the base 60 is measured using the first displacement sensor 74a. The control section 300 is caused to store this distance as a zero point where the distance between the wafer Wf and the head 30 is zero. At this time, the distance between the base 60 and the surface of the wafer Wf is measured using the second displacement sensor 74b and the control section 300 is caused to store the measured distance. In this way, since the distance between the base 60 and the surface of the wafer Wf can always be monitored using the second displacement sensor 74b even when the height of the surface of the wafer Wf is not constant, it is possible to perform control so that the state of contact between the head 30 and the wafer Wf becomes optimum by controlling the amount of gas supplied to the mechanical stopper device 100 or the fluid storing chamber 37 in accordance with a change in the height of the surface of the wafer Wf. In the case of the substrate processing apparatus 10 in FIG. 11, since the second displacement sensor 74b is always monitoring the distance between the base 60 and the surface of the wafer Wf, it is not necessary to measure zero points at a plurality of locations on the wafer Wf in advance as in the case of the substrate processing apparatus 10 in FIG. 9.

Figure 21:
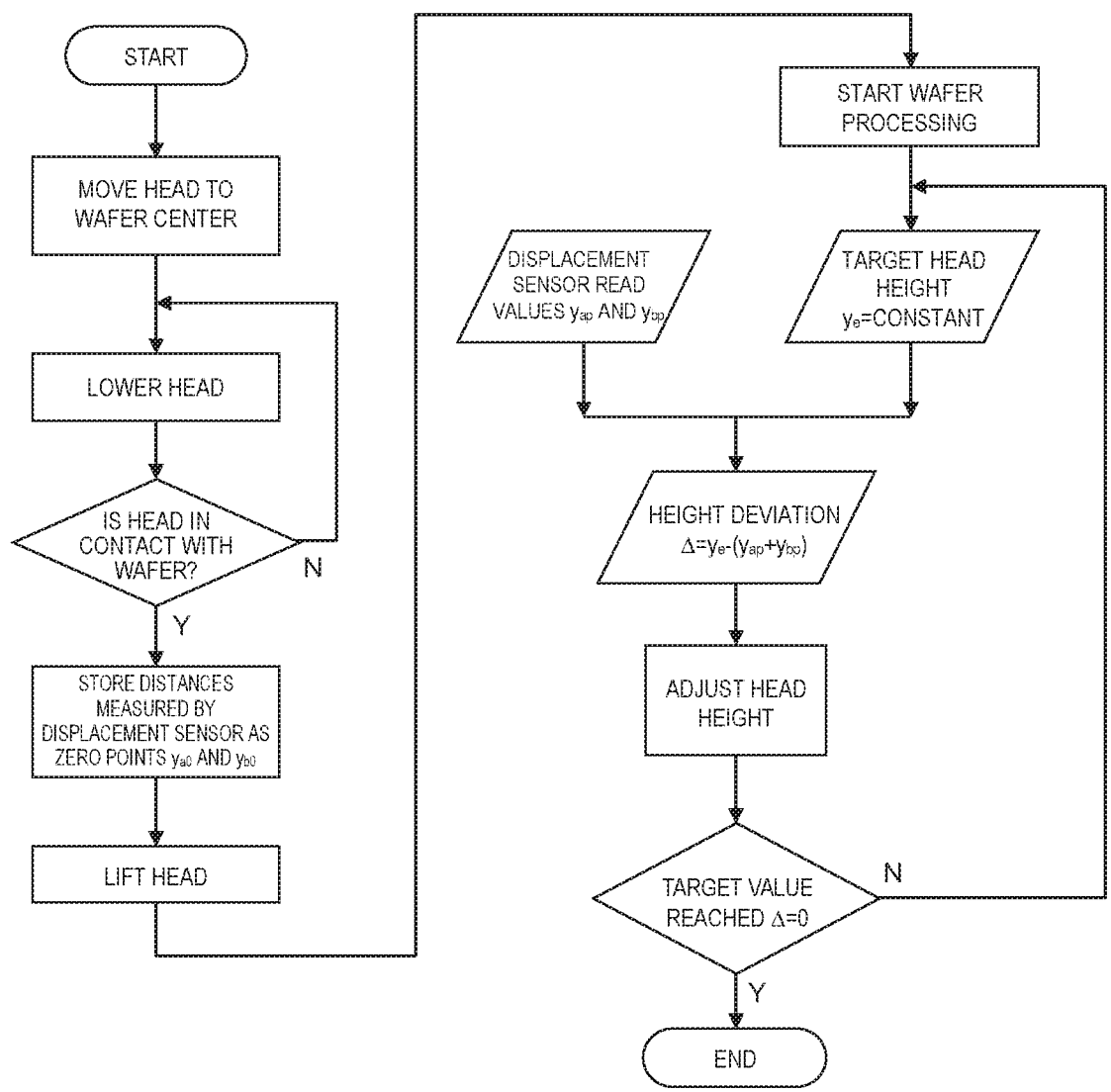
FIG. 21 is a diagram illustrating a flow for processing the wafer Wf while performing head height control using a displacement sensor in the substrate processing apparatus shown in FIG. 11 according to the embodiment.

FIG. 21 is a diagram illustrating a flow for processing the wafer Wf while performing head height control using the displacement sensors 74a and 74b in the substrate processing apparatus 10 according to the embodiment shown in FIG. 11. In the substrate processing apparatus 10 shown in FIG. 11, since the displacement sensor 74b can directly measure the height of the base 60 with respect to the wafer Wf, it is not necessary to calculate zero points using the aforementioned approximate equation. As shown in FIG. 21, the head 30 is moved, for example, to the vicinity of the center of the wafer Wf before starting processing of the wafer Wf, while keeping the head 30 in contact with the wafer Wf, the distance between the lifting member 68 and the base 60 and the distance between the base 60 and the wafer Wf are measured using the displacement sensors 74a and 74b, and the control section 300 is caused to store the measured distances as zero points $y_{a0}$ and $y_{b0}$. When the processing of the wafer Wf is started, a current height $y_{ap}+y_{bp}$ of the head 30 is calculated from the output values $y_{ap}$ and $y_{bp}$ of the respective displacement sensors 74a and 74b. During the processing of the wafer Wf, a deviation $\Delta=y_e-(y_{ap}+y_{bp})$ is calculated from the height $y_{ap}+y_{bp}$ of the current head and the target height $y_e$, and the head height is adjusted based on the deviation $\Delta$. These calculations and control of the substrate processing apparatus 10 can be performed by the control section 300. When the table 20 is provided with the extension part 21, the height of the extension part 21 may also be adjusted using the displacement sensors 74a and 74b to be the same as the height of the wafer Wf on the table. Furthermore, when the head 30 is located on the extension part 21 during processing of the wafer Wf, control may be performed so as to obtain an optimum height of the head 30 as described above.

Figure 12:
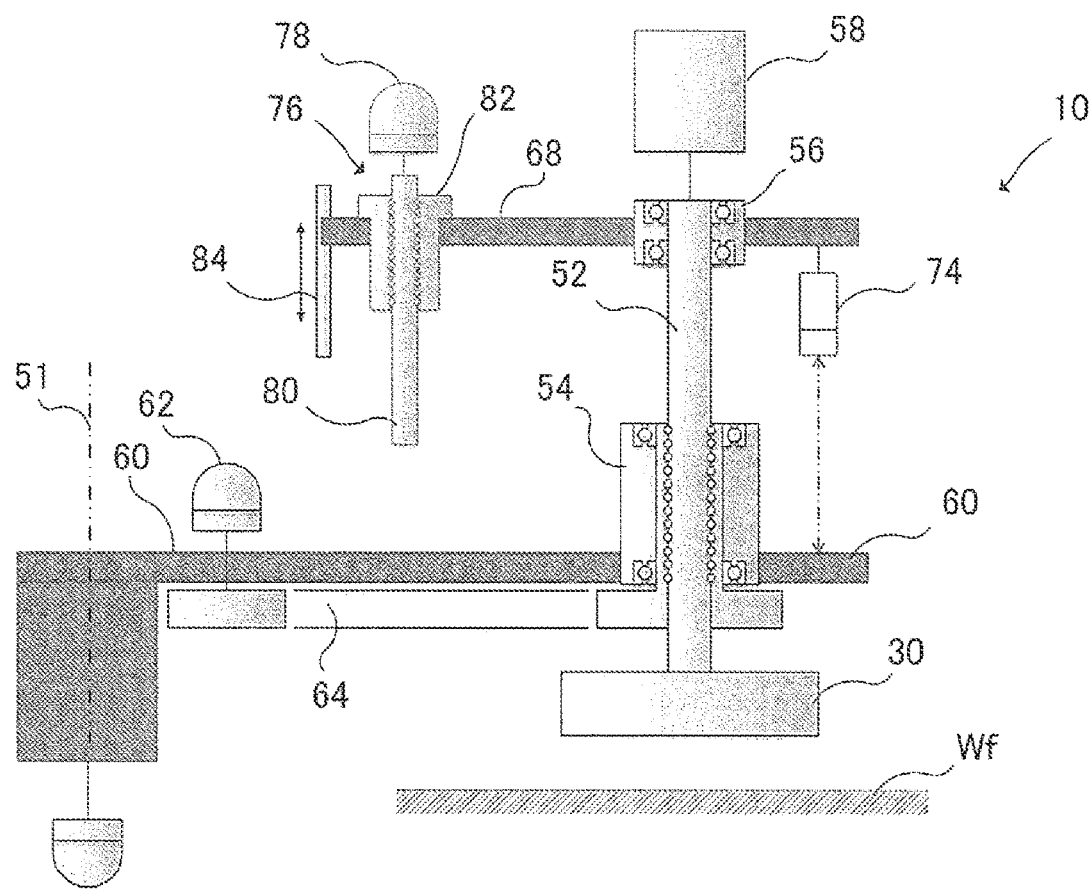
FIG. 12 is a side view schematically illustrating a configuration of a substrate processing apparatus according to an embodiment.

FIG. 12 is a side view schematically illustrating a configuration of the substrate processing apparatus 10 according to an embodiment. The substrate processing apparatus 10 in FIG. 12 is different from the substrate processing apparatus 10 in FIG. 1 in the lifting mechanism of the head 30. The substrate processing apparatus 10 in FIG. 12 includes a ball screw 76 and a motor 78 to drive the ball screw 76. A screw shaft 80 of the ball screw 76 extends in a direction perpendicular to the surface of the wafer Wf. An outer cylinder 82 of the ball screw 76 is connected to the lifting member 68. The lifting member 68 can be moved in a direction perpendicular to the surface of the wafer Wf along a linear guide 84. By causing the motor 78 to rotate the screw shaft 80 of the ball screw 76, the lifting member 68 moves in the direction perpendicular to the surface of the wafer Wf along the linear guide 84 fixed to the base 60 together with the outer cylinder 82. Driving of the motor 78 is controlled by the control section 300. Therefore, by controlling the motor 78, it is possible to adjust the height of the head 30 with respect to the surface of the wafer Wf. Note that though not shown in FIG. 1, and FIG. 8 to FIG. 11, the lifting member 68 can be moved in the direction perpendicular to the surface of the wafer Wf using guide means similar to the linear guide 84 shown in FIG. 12.

The substrate processing apparatus 10 in FIG. 12 includes the displacement sensor 74 attached to the lifting member 68. As in the case of the displacement sensor 74 shown in FIG. 9, the displacement sensor 74 can measure the distance between the lifting member 68 and the base 60. In the substrate processing apparatus 10 in FIG. 12, an arrangement similar to that of the displacement sensors 74 in FIGS. 10 and 11 can also be adopted. In the substrate processing apparatus 10 in FIG. 12, the displacement sensor 74 may be omitted.

In the substrate processing apparatus 10 in FIG. 12, a head similar to the head 30 shown in FIG. 4 to FIG. 8 can be adopted as the head 30.

In the substrate processing apparatus 10 in FIG. 12, a zero point at the height of the head 30 with respect to the surface of the wafer Wf can be determined as follows. First, the ball screw 76 is caused to move the lifting member 68 downward while monitoring torque of the motor 78 before starting processing of the wafer Wf. The torque that applies to the motor 78 the moment the head 30 comes into contact with the wafer Wf starts to increase. Therefore, descending of the lifting member 68 is stopped immediately after the torque applied to the motor 78 starts to increase. The control section 300 is caused to store the position of the ball screw 76 at that time as a zero point. In the substrate processing apparatus 10 in FIG. 12, by controlling the motor 78 of the ball screw 76, it is possible to control a state of contact between the head 30 and the surface of the wafer Wf. As described in the other embodiments, control may be performed so as to maintain an optimum state of contact between the head 30 and the wafer Wf by measuring and monitoring the height of the head 30 with respect to the surface of the wafer Wf using the displacement sensor 74, controlling the motor 78 and/or controlling the amount of gas supplied to the fluid storing chamber 37 of the head 30.

REFERENCE SIGNS LIST

10 . . . Substrate processing apparatus
20 . . . Table
30 . . . Head
31 . . . Head body
32 . . . Airbag
33 . . . Pad
35 . . . Processing liquid passage
36 . . . Gas supply channel
37 . . . Fluid storing chamber
38 . . . Elastic film
40 . . . Processing liquid supply section
50 . . . Swing arm
51 . . . Center of rotation
52 . . . Shaft
54 . . . Ball spline
56 . . . Slip ring
58 . . . Rotary joint
60 . . . Base
62 . . . Motor
64 . . . Belt
66 . . . Air cylinder
68 . . . Lifting member
70 . . . Gas supply source
72 . . . Electropneumatic regulator
74 . . . Displacement sensor
74a . . . First displacement sensor 74b . . . Second displacement sensor
76 . . . Ball screw
78 . . . motor
80 . . . Screw shaft
82 . . . Outer cylinder
84 . . . Linear guide
100 . . . Mechanical stopper device
102 . . . First wedge-shaped member
104 . . . Second wedge-shaped member
106 . . . First inclined surface
108 . . . Second inclined surface
110 . . . Screw receiving part
112 . . . Bolt
114 . . . Head
120 . . . Ball screw
122 . . . Motor
124 . . . Screw shaft
126 . . . Nut
130 . . . Bolt
300 . . . Control section
PL . . . Processing liquid
Wf . . . Wafer

What is claimed is:

1. A substrate processing apparatus comprising:
a table provided with a substrate holding surface for holding a substrate;
a pad for processing the substrate held on the table;
a head for holding the pad;
an actuator for moving the head in a direction perpendicular to the substrate holding surface of the table; and
a mechanical stopper device for stopping a movement of the head in the direction perpendicular to the substrate holding surface,
wherein the mechanical stopper device comprises:
a first member that is configured to move in a first direction which is a direction parallel to the substrate holding surface and has a first inclined surface that forms a predetermined angle with respect to the first direction; and
a second member that has a second inclined surface that slidably contacts the first inclined surface of the first member, and
the second member is provided with a stopping surface for defining a stop position of the head when the actuator or a lifting member comes into contact the stopping surface, the lifting member configured to lift or lower the actuator and being connected to the actuator, and
the stopping surface of the second member is displaceable in a second direction perpendicular to the substrate holding surface when the first member moves in the first direction.

2. The substrate processing apparatus according to claim 1, wherein the mechanical stopper device comprises a ball screw for moving the first member in the first direction, and
a screw shaft of the ball screw extends in the first direction.

3. The substrate processing apparatus according to claim 2, wherein the screw shaft of the ball screw is driven to rotate by a motor.

4. The substrate processing apparatus according to claim 1, wherein the second member of the mechanical stopper device comprises:
a bolt extending in the second direction; and
a screw receiving part configured to receive the bolt, and the stopping surface is defined in the head of the bolt.

5. The substrate processing apparatus according to claim 1, wherein the predetermined angle of the first inclined surface is determined so that the second member is not displaced with respect to the first member when a force F is applied from the actuator to the second member of the mechanical stopper device.

6. The substrate processing apparatus according to claim 1, wherein the actuator comprises an air cylinder for moving the head under an air pressure.

7. The substrate processing apparatus according to claim 1, further comprising:
a displacement sensor configured to measure a position of the head with respect to the surface of the substrate held on the table;
a base member disposed at a predetermined distance with respect to the substrate holding surface of the table,
wherein the displacement sensor is attached to the lifting member and configured to measure a distance between the lifting member and the base member.

8. The substrate processing apparatus according to claim 7, wherein the displacement sensor is attached to the lifting member and configured to measure a distance between the lifting member and the surface of the substrate held on the table.

9. The substrate processing apparatus according to claim 7, further comprising a second displacement sensor attached to the base member,
wherein the second displacement sensor configured to measure a distance between the base member and the surface of the substrate held on the table.

10. The substrate processing apparatus according to claim 1, wherein the head comprises a fluid storing chamber that stores a fluid,
the fluid storing chamber includes an elastic region that is elastically deformed in accordance with a pressure of the fluid stored, and
the pad is attached to the elastic region.

11. The substrate processing apparatus according to claim 10, wherein the fluid storing chamber is formed of an airbag.

12. The substrate processing apparatus according to claim 10, wherein the elastic region of the fluid storing chamber is formed of an elastic film.

13. The substrate processing apparatus according to claim 10, further comprising an electropneumatic regulator for controlling a pressure of the fluid supplied to the fluid storing chamber.

14. The substrate processing apparatus according to claim 1, wherein the substrate processing apparatus processes the substrate through catalyst referred etching.

15. The substrate processing apparatus according to claim 1, wherein the pad comprises an opening, and
the opening is configured to supply a fluid to be used for processing of the substrate to the surface of the substrate.

* * * * *